US006483741B1

(12) United States Patent
Iwasaki et al.

(10) Patent No.: US 6,483,741 B1
(45) Date of Patent: Nov. 19, 2002

(54) MAGNETIZATION DRIVE METHOD, MAGNETIC FUNCTIONAL DEVICE, AND MAGNETIC APPARATUS

(75) Inventors: Yoh Iwasaki, Kanagawa (JP); Teiichi Miyauchi, Kanagawa (JP); Kazuhiro Bessho, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/664,467

(22) Filed: Sep. 18, 2000

(30) Foreign Application Priority Data

Sep. 17, 1999 (JP) .......................................... 11-264629

(51) Int. Cl.[7] .......................... G11C 11/18; G11C 11/15
(52) U.S. Cl. ....................................... 365/170; 365/173
(58) Field of Search ................................ 365/170, 171, 365/173, 172, 158

(56) References Cited

U.S. PATENT DOCUMENTS 5,695,864 A * 12/1997 Slonczewski ............... 428/212
5,703,805 A * 12/1997 Tehrani et al. .............. 365/173
5,930,165 A * 7/1999 Johnson et al. ............. 365/171
5,982,660 A * 11/1999 Bhattacharyya et al. .... 365/173

* cited by examiner

Primary Examiner—Richard Elms
Assistant Examiner—Anh Phung
(74) Attorney, Agent, or Firm—Sonnenschein, Nath & Rosenthal

(57) ABSTRACT

A magnetic functional device allowing magnetization switching at a high speed even if the size of a magnetic substance is made finer on the sub-micron order. The magnetic functional device includes an information carrier layer formed by a magnetic substance; and a strain-imparting layer (such as piezoelectric layer) formed below the information layer and operably configured to impart a drive force to change the direction of a magnetization vector lying in a first plane of the information carrier thereby processing binary or more information by magnetization directions of the information carrier layer; wherein the drive force is applied in pulse to the information carrier layer in a direction nearly perpendicular to the first plane in which lies the magnetization vector of the information carrier layer when the magnetization vector is in an initial state before the application of the drive force. An effective field derived from a magnetic anisotropy or exchange interaction is used as the drive force.

44 Claims, 7 Drawing Sheets

MAGNETIZATION DRIVE METHOD, MAGNETIC FUNCTIONAL DEVICE, AND MAGNETIC APPARATUS

RELATED APPLICATION DATA

The present application claims priority to Japanese Application No. P11-264629 filed Sep. 17, 1999, which application is incorporated herein by reference to the extent permitted by law.

BACKGROUND OF THE INVENTION

The present invention relates to a magnetization drive method, a magnetic functional device, and a magnetic apparatus, which are typically suitable to be used for solid-state magnetic memories.

As compared with semiconductor devices, magnetic devices using magnetic substances have the following merits. First, since components of a magnetic device can be made from metals having high carrier densities and low resistances, such a magnetic device may be suitable for realizing a very fine-structure of the magnetic device, such as a structure having sub-micron dimensions. Second, since a magnetic substance exhibits bi-stable magnetization directions, the magnetization state of the magnetic substance can be stably kept even when external energy is not given to the magnetic substance, with a result that such a magnetic substance is suitable for realizing a non-volatile memory function. Third, if a magnetic field having a sufficient strength is applied externally to a magnetic substance of a magnetic device, a magnetization direction of the magnetic substance can be changed into the field direction for a time being as short as about 1 ns, and accordingly, the magnetic device can realize very fast switching of the magnetization direction.

Magnetic devices using magnetic substances, which have the above-described merits, may be applied to high integration solid-stage memories operated at high speeds to realize energy-saving.

However, the benefit associated with high speed operation of magnetic devices tends to be lost along with the progress of the degree of fineness of fine-structures of the magnetic devices due to the following causes:

One of the causes is that, as described in the earlier application by the present applicant, Japanese Patent Laid-open No. Hei 10-130711, as wires become thinner along with the progress of fineness of a finer-structure of a magnetic device, the amount of a current flowing through the wires tends to be restricted, thereby making it impossible to generate a magnetic field having a sufficient strength. The stronger the magnetic field applied to the magnetic device, the faster the magnetization switching speed thereof. Accordingly, the restriction of the applied magnetic field limits the switching speed of the magnetic device.

Another cause is that as the size of a magnetic substance whose magnetization direction is to be switched becomes small, a damping force applied to damp the movement of a magnetization vector of the magnetic substance becomes small. If the damping force becomes excessively small, the magnetization vector continuously rounds around the field direction, with a result that it takes a lot of time for the magnetization vector to be converged in the field direction.

The reason why the damping force applied to damp the movement of a magnetization vector of a magnetic substance becomes small with a reduction in size of the magnetic substance will be described below. In a magnetic metal thin film used for a solid-state magnetic memory such as a magnetic random access memory (MRAM), during movement of magnetization, an eddy current flow in the direction in which the eddy current obstructs the movement of the magnetization. A Joule heat generated by the eddy current is the dominant part of the loss in movement of magnetization. An eddy current loss density per volume, $p(W/m^3)$ is approximately proportional to the cross-section of the magnetic thin film, that is, a magnetic substance. That is to say, as the size of a magnetic substance becomes small, the strength of a damping force applied to damp a magnetization vector of the magnetic substance becomes small approximately in proportion to the square of the size of the magnetic substance.

SUMMARY OF THE INVENTION

An object of the present invention is to provide a magnetic functional device including a magnetic substance, which allows magnetization switching at a high speed even if the size of the magnetic substance is made finer on the sub-micron order, a magnetization drive method for the magnetic functional device, and a magnetic apparatus using the magnetic functional device.

First, a general theory concerned with the movement of a magnetization vector will be described.

An equation of a magnetic moment is given, for example, by Landau and Lifshits as follows:

$$dM/dt = -\gamma \cdot (M \times H) - (\alpha \cdot \gamma / M_s) \cdot \{M \times (M \times H)\} \quad (1)$$

where M is a magnetization vector, H is a vector of a magnetic field, $\gamma$ is a gyromagnetic constant, and a is $\alpha$ damping factor. If $\alpha$ is significantly larger than 1, the magnetization vector is slowly converged to the direction of an external magnetic field. For example, when a magnetic field in the −x direction is applied to a magnetization vector directed nearly in the +x direction within an xy plane, if the damping is large, the magnetization vector slowly rounds within the xy plane to be converged in the field direction, to attain the magnetization reversal. This state is shown in FIG. 1A. As shown in this figure, the magnetization vector rounds in the order of arrows 0 (initial state)→1→2→3→4→5, to be finally converged in the −x direction by relaxation.

On the contrary, if $\alpha$ is significantly smaller than 1 and thereby the first term of the equation (1) becomes dominant, the change in magnetization vector with time, that is, dM/dt is usually perpendicular to the direction from M to H. Accordingly, the magnetization vector M undergoes precession rounding around the field vector H with an angle from the field vector H kept constant.

In the case of a magnetic substance in which $\alpha$ contributes to movement of a magnetization vector although the value of $\alpha$ is small, when a magnetic field in the −x direction to a magnetization vector directed in the + direction, the magnetization vector undergoes the precession rounding around the x-axis with an open angle from the x-axis gradually increased, and is finally relaxed to the field direction. A first half of a spiral locus of the termination of the magnetization vector is shown in FIG. 1B.

The magnetization reversal caused by a magnetic field directed in the direction reversed 180° to the magnetization vector in the initial state is generally intermediate between the above-described magnetization reversal with an extremely large damping factor $\alpha$ and the magnetization reversal with an extremely small damping factor $\alpha$. The time required for magnetization reversal is important as a parameter determining the operational speed of a magnetic device.

If the damping factor α is extremely large, the movement of the magnetization vector depicts a locus nearly along the shortest distance; however, the movement is slow and thereby the reversal time is long. On the contrary, if the damping factor a is significantly small, the movement of the magnetization vector is quick; however, it depicts a spiral locus and thereby the time required for the magnetization vector to be converged to the final state is long. The quickest magnetization reversal is obtained with the damping factor set at 1 (α=1). Such a damping state allowing the quickest response is called "a critical damping state".

For example, in the case of Permalloy (NiΘFe alloy) often used for a magnetic functional device such as an MRAM, the critical damping appears when the size of the device is about 1 μm, and accordingly, the design of most of MRAMs having the size of about 1 μm, which have been extensively developed at present, is advantageous in making effective use of the material characteristic, that is, the critical damping of Permalloy. The damping, however, is nearly proportional to the square of the size of a magnetic device as described above, so that if a magnetic device has a fine structure, the degree of fineness of which is on the order of sub-micron, such a device causes a problem that the speed of magnetization reversal becomes slow because of the insufficient damping.

The quick switching of magnetization of a magnetic device using a magnetic substance, which has a fine-structure and thereby has an insufficient damping, is attained by the following drive method.

As shown in FIG. 1C, a magnetic field or an effective field equivalent thereto, which is derived by a magnetic anisotropy or exchange interaction, is applied in the direction (z-direction in the figure) perpendicular to the magnetization vector "0" in the initial state, which is directed in the +x direction. In this case, since it is assumed that the damping is small, the magnetization vector is not moved to the field direction but undergoes the precession around the z-axis.

To be more specific, as shown in FIG. 1C, the magnetization vector is turned nearly within the xy-plane in the order of the arrows 1 2 3 4 5. On halfway of the precession motion, the drive force in the z-direction is cut off at the moment when the magnetization vector is nearly directed to the –x direction, that is, reaches the state shown by the arrow "4" in FIG. 1C. At this time, the magnetization remains in the –x direction, to be reversed from the initial state by 180°. The time required for this magnetization reversal is nearly equivalent to a half of one cycle of the precession motion. With this drive method, even if the damping factor α is significantly small, it is possible to realize magnetization reversal quicker than the magnetization reversal via the precession motion repeated by several times as shown in FIG. 1B.

Such a method for driving magnetization reversal shown in FIG. 1C is hereinafter referred to as "swing-by switching". This wording expresses a feature of the present invention in which a magnetization vector is moved toward a drive force but is moved toward a final state while passing by the drive force.

Results of numerical examination of such a swing-by switching will be described below.

The process of magnetization reversal of a magnetic substance performed by swing-by switching is numerically calculated on the basis of the equation (1), and the results thereof are shown in FIG. 2. An effective field used for calculation contains not only an external magnetic field but also effects of an uniaxial magnetic anisotropy and demagnetization field. A single magnetic domain Permalloy thin film is used as the magnetic substance. A saturation magnetization Ms is set at 800 emu/cm$^3$. An easy axis of magnetization of the uniaxial induced magnetic anisotropy is set to correspond to the x-axis. An anisotropy field HK is set at 4 Oe. The damping factor α is set at 0.01. A magnetization vector in the initial state is set in the +x direction, and a magnetic field of 1 kOe is applied in the +z direction for a time of 0.2 ns. Under these conditions, the process of magnetization reversal performed by the swing-by switching is examined.

In FIG. 2, the abscissa indicates a time (ns), and the ordinate indicates an azimuth angle (°) representing the direction of the magnetization vector, which angle is measured within the xy-plane with respect to the +x direction. It should be noted that the magnetization vector has a component in the z direction; however, in the case of the thin film sample, the rise of the magnetization in the z direction perpendicular to the film surface is obstructed by the demagnetization field, and therefore, the component is negligible.

As shown in FIG. 2, the azimuth angle of the magnetization vector is linearly increased after application of the magnetic field, and after an elapse of 0.2 ns, the azimuth angle exceeds 160°. At this time, since the application of the magnetic field is stopped, the magnetization vector undergoes the anisotropic magnetic field and the demagnetization field. That is to say, since the direction of the effective field is changed from that during application of the external magnetic field, the axis of the precession motion is instantly changed, and thereby the rate of change of the azimuth angle becomes discontinuous. However, since the magnetization vector is already separated from the initial state by 90° or more and is within a range of an attractive force toward an easy axis of magnetization directed in the –x direction, the magnetization vector is oscillatingly relaxed in the 180° direction to be thus converged to the final state. It takes only 0.2 ns to drive the magnetization vector toward the final state.

A result of calculating the process of magnetization reversal of a comparative example, in which a magnetic field of 5 Oe is applied to a magnetization vector directed in the + direction in the initial state, is shown in FIG. 3. As shown in FIG. 3, it takes a lot of time for the magnetization vector to be separated from the +x direction.

The function of changing the direction of a magnetization vector by 90° or 180° is called a magnetization switching function. This function may be assembled with another function, to produce a magnetic device exhibiting various functions. For example, the composite of the magnetization switching function and a spin valve structure, in which writing is performed by the magnetization switching function and the magnetization state is read out by the spin valve, is applied to a memory, and further, since a current flowing in an output circuit can be controlled by the same configuration, such a composite structure can be applied to a switching device replaced from a transistor, and to a logic device by combination of the switching devices.

A general theory associated with the precession and relaxation of a turning magnetization vector has been reported by S. Chikazumi, Physics of ferromagnetism, John Wiley & Sons, Inc., 1964.

It has been already pointed out by a document ("Engineering of Magnetic Thin Film" edited by Ryouta Sakurai, paragraph 4.2.2, Maruzen, 1977) and a paper cited in the document (D. O. Smith, J. Appl. Phys. 29, 264 (1958)) that the magnetization switching for a uniaxial anisotropic magnetic thin film becomes faster by adding a field component perpendicular to an easy axis of magnetization.

A paper recently published (R. L. Stamps, and B. Hillebrands, Appl. Phys. Lett. 75, 1143 (1999) has described that, upon reversal of a magnetization vector directed in an easy axis of magnetization by applying a magnetic field in the reversed direction to the magnetization vector, the rise of the magnetization reversal can be effectively accelerated by adding a small bias magnetic field in the direction perpendicular to the easy axis of magnetization. The content of this document is common to that of the above document by D. O. Smith.

In recent years, there has been reported an experiment performed by making a high speed pulse electron beam penetrate a perpendicular magnetization film, to generate a magnetic flux caused in the shape of concentric circle around the beam, and causing magnetization reversal by a combination of the easy axis of magnetization in the vertical direction and a magnetic field due to the magnetic flux thus generated within a plane of the film (C. H. Back, D. Weller, J. Heidmann, D. Mauri, D. Guarisco, E. L. Garwin, and H. C. Siegmann, Phys. Rev. Lett. 81, 3251 (1998)).

In this way, the effect of a magnetic field in the direction perpendicular to a magnetization vector exerted on magnetization reversal has been studied for a long time as a natural phenomenon.

However, the contents of the above-described documents, the paper by D. O. Smith, the handbook by Sakurai, and the paper by R. L. Stamps, and B. Hillebrands are characterized in that the main field component is opposed to the magnetization vector in the initial state, and the field component perpendicular to the magnetization vector is small and only functions as a supplementary field component. These documents do not teach even the possibility that the vertical or perpendicular field is used as a main drive force for driving the magnetization reversal like the present invention.

The above-described report by C. H. Back, et al. has experimentarily showed that magnetization reversal occurs by a pulse field perpendicular to the magnetization direction; however, they have made the experiment on a large scale by making an electron beam penetrate the magnetic thin film placed in vacuum, and have not described the application of the technique to practical information storage apparatuses such as a hard disk drive mainly used at present for magnetic recording, or a small-sized solid-state magnetic memory. Further, the arrangement disclosed in this document is limited to application of the magnetic field directed in the direction within the plane of the film to the perpendicular magnetization film.

To solve the above problems, according to a first embodiment of the present invention, there is provided a magnetization drive method including the step of: changing the direction of a magnetization vector of a magnetic substance by applying a drive force to the magnetic substance; wherein the drive force is applied in pulse to the magnetic substance in the direction nearly perpendicular to the magnetization vector of the magnetic substance in the initial state before the application of the drive force.

According to a second embodiment, there is provided a magnetic functional device including: an information carrier formed by a magnetic substance; and drive force applying means for changing the direction of a magnetization vector of the information carrier, thereby processing binary or more information by magnetization directions of the information carrier; wherein the drive force is applied in pulse to the information carrier in the direction nearly perpendicular to the magnetization vector of the information carrier in the initial state before the application of the drive force.

In the above second embodiment, the information carrier and the drive force applying means may be integrally assembled on a substrate, to function as a solid-state device. An effective magnetic field derived from a magnetic anisotropy or an effective magnetic field derived from an exchange interaction applied from a different magnetic substrate coupled to the information carrier may be used as the drive force. A magnetic substance having a uniaxial magnetic anisotropy may be used as the magnetic substance constituting the information carrier, and binary information be processed by normal and reversal magnetization directions along an easy axis of magnetization of the magnetic substance; and a drive force for reversal of magnetization be applied in the direction nearly perpendicular to the easy axis of magnetization of the information carrier.

According to a third embodiment, there is provided a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the drive force is obtained by generating a magnetic anisotropy having an easy axis of magnetization directed in the direction nearly perpendicular to the easy axis of magnetization of the information carrier in the static state.

In the above third embodiment, the magnetic anisotropy functioning as the drive force may be a stress-induced magnetic anisotropy. The information carrier may be formed by a magnetic thin film having a magnetic anisotropy changed sensitively to a strain (or stress), the magnetic thin film being stacked to a piezoelectric layer; and a voltage be applied in the thickness direction of the piezoelectric layer, to generate the stress-induced magnetic anisotropy. The information carrier may be formed by a magnetic thin film having a magnetic anisotropy changed sensitively to a strain, the magnetic thin film being stacked to a strain imparting layer; and a uniaxial strain be imparted to the strain imparting layer in a specific direction within a plane of the strain imparting layer, to generate the stress-induced magnetic anisotropy having an easy axis of magnetization directed in the specific direction. The information carrier may be formed by a perpendicular magnetization film having the easy axis of magnetization in the static state which is directed in the direction perpendicular to a plane of the perpendicular magnetization film; and the drive force be applied in the direction nearly parallel to the plane of the information carrier. In addition, the strain used for generating a stress-induced magnetic anisotropy is not limited to an uniaxial strain but may be a strain being isotropic in a plane.

According to a fourth embodiment, there is provided a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the drive force is generated by an exchange interaction applied from a different magnetic substance provided adjacently to the information carrier.

In the above fourth embodiment, the information carrier may be formed by a thin film or a flat magnetic substance having the easy axis of magnetization in the static state within a plane of the magnetic substance; and the drive force be applied in the direction nearly perpendicular to the plane of the information carrier. A magnetic layer to be controlled, which constitutes the information carrier, may be stacked on a fixed magnetization layer via an intermediate layer; and the strength of an exchange interaction between the magnetic layer to be controlled and the fixed magnetization layer be changed by the effect of the intermediate layer. The information carrier may be formed by a perpendicular magnetization film having the easy axis of magnetization in the static state which is directed in the direction perpendicular to a plane of the perpendicular magnetization film; and the drive force be applied in the direction nearly parallel to the plane of the information carrier. A magnetic layer to be controlled, which is formed by the perpendicular magnetization film constituting the information carrier, may be stacked on a fixed magnetization layer via a connection control layer; and the strength of an exchange interaction between the magnetic layer to be controlled and the fixed magnetization layer be changed by the effect of the connection control layer.

According to a fifth embodiment, there is provided a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the drive force is derived from a magnetic field applied to the information carrier from external.

According to a sixth embodiment, there is provided a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the information carrier has a composite structure in which two or more magnetic substance layers are stacked to each other.

In the above sixth embodiment, the two or more magnetic substance layers constituting the information carrier may include a magnetic substance layer having an easy axis of magnetization directed in the direction nearly perpendicular to a plane of the magnetic layer. The two or more magnetic substance layers constituting the information carrier may be composed of an anisotropy imparting layer and a magnetic thin film having a magnetic anisotropy changed sensitively to a strain. The information carrier may have a structure in which a strain imparting layer, the magnetic thin film, and the anisotropy imparting layer are sequentially stacked to each other. The information carrier may have a structure in which the magnetic thin film, the anisotropy imparting layer, a connection control layer, and a fixed magnetization layer are sequentially stacked to each other. The information carrier may have a structure in which a strain imparting layer, the magnetic thin film, the anisotropy imparting layer, a connection control layer, and a fixed magnetization layer are sequentially stacked to each other.

According to a seventh embodiment, there is provided a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the magnetization vector in the static state of the information carrier is tilted by a specific angle with respect to the easy axis of magnetization in the static state.

According to an eighth embodiment, there is provided a magnetic apparatus including: (A) a magnetic functional device including: an information carrier formed by a magnetic substance; and drive force applying means for changing the direction of a magnetization vector of the information carrier, thereby processing binary or more information by magnetization directions of the information carrier; wherein the drive force is applied in pulse to the information carrier in the direction nearly perpendicular to the magnetization vector of the information carrier in the initial state before the application of the drive force; and (B) means for reading out a magnetization direction of the information carrier of the magnetic function device by a Hall effect or magneto-resistance effect.

According to a ninth embodiment, there is provided a magnetic apparatus including: (A) a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the drive force is obtained by generating a magnetic anisotropy having an easy axis of magnetization directed in the direction nearly perpendicular to the easy axis of magnetization of the information carrier in the static state; and (B) means for reading out a magnetization direction of the information carrier of the magnetic function device by a Hall effect or magneto-resistance effect.

According to a tenth embodiment, there is provided a magnetic apparatus including: (A) a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the drive force is generated by an exchange interaction applied from a different magnetic substance provided adjacently to the information carrier; and (B) means for reading out a magnetization direction of the information carrier of the magnetic function device by a Hall effect or magneto-resistance effect.

According to an eleventh embodiment, there is provided a magnetic apparatus including: (A) a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the drive force is derived from a magnetic field applied to the information carrier from external; and (B) means for reading out a magnetization direction of the information carrier of the magnetic function device by a Hall effect or magneto-resistance effect.

According to a twelfth embodiment, there is provided a magnetic apparatus including: (A) a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the information carrier has a composite structure in which two or more magnetic substance layers are stacked to each other; and (B) means for reading out a magnetization direction of the information carrier of the magnetic function device by a Hall effect or magneto-resistance effect.

According to a thirteenth embodiment, there is provided a magnetic apparatus including: (A) a magnetic functional device including: an information carrier formed by a magnetic substance having a uniaxial magnetic anisotropy; and drive force applying means for applying a drive force, which is used for reversing the direction of a magnetization vector of the information carrier, in pulse to the information carrier in the direction nearly perpendicular to an easy axis of magnetization of the information carrier in a static state, thereby processing binary information by magnetization directions of the information carrier; wherein the magnetization vector in the static state of the information carrier is tilted by a specific angle with respect to the easy axis of magnetization in the static state; and (B) means for reading out a magnetization direction of the information carrier of the magnetic function device by a Hall effect or magneto-resistance effect.

The examples of the above-described magnetic apparatuses may include various kinds of functional apparatuses such as a magnetic recording apparatus, a current switching device, a voltage switching device, a logic device, and a magnetic base type computer.

According to the present invention, the size of a magnetic substance or an information carrier of the magnetic functional device of the present invention may be determined as needed, and in particular, if a fine-structure of the magnetic functional device is intended to be made finer, the length of the maximum side of the device may be on the order of sub-micron, more specifically, be selected in a range of 500 nm or less.

The magnetic functional device of the present invention can be applied not only to a magnetic storage apparatus but to various apparatuses making use of the magnetization switching, for example, a current control device.

According to the present invention configured as described above, since the direction of a magnetization vector of a magnetic substance or information carrier of the magnetic functional device is reversed by applying, in pulse, a drive force derived from a magnetic anisotropy or exchange interaction in the direction nearly perpendicular to an easy axis of magnetization of the magnetic substance or information carrier in the static state, that is, the swing-by switching operation is performed, even if the size of the magnetic substance or information carrier, particularly the size of the maximum side thereof is made finer on the order of sub-micron and further deep sub-micron, a significantly displacement of the magnetization starts directly after application of the drive force without being affected by an insufficient damping to the magnetization vector, with a result that it is possible to reverse the direction of the magnetization vector without depicting an useless locus, and hence to carry out the swing-by switching operation at a high speed.

DETAILED DESCRIPTION OF THE PREFERRED EMBODIMENTS

Hereinafter, preferred embodiments of the present invention will be described in detail with reference to the accompanying drawings.

Figure 1A:
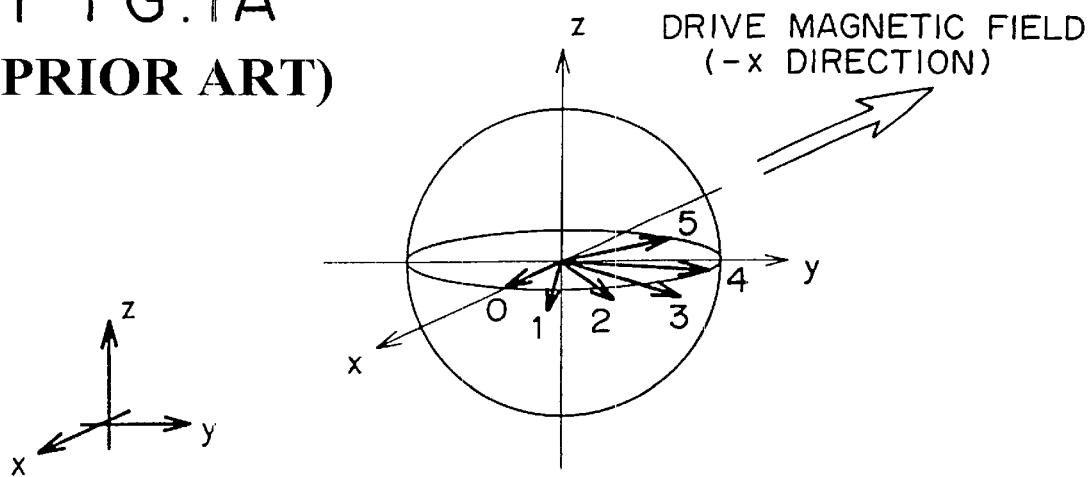
FIGS. 1A to 1C are schematic diagrams illustrating the precession and relaxation of a magnetization vector in a magnetic field.
Figure 1B:
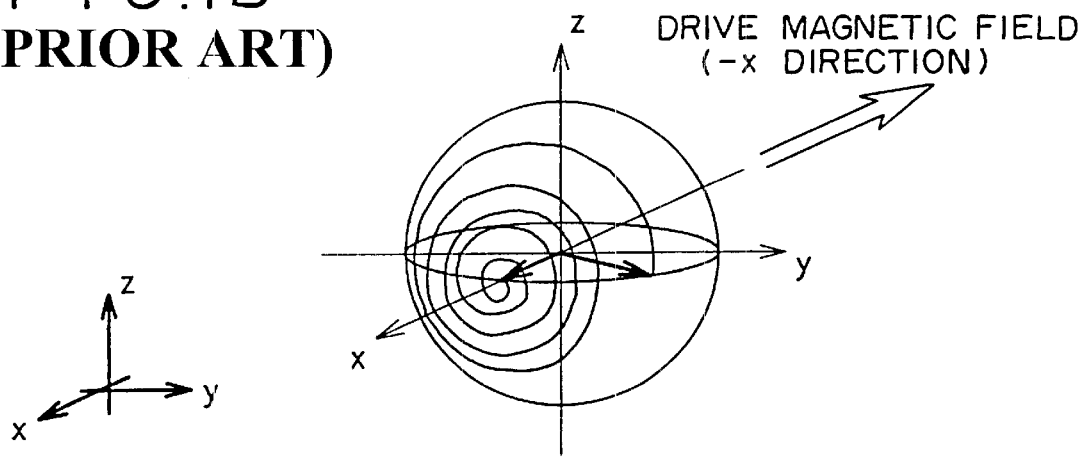
Figure 1C:
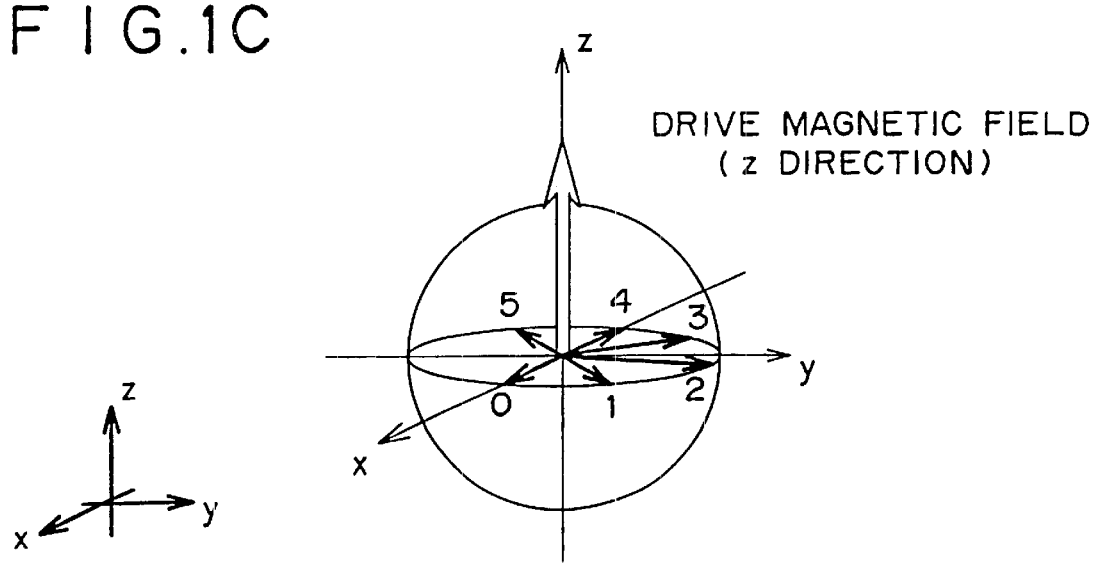
Figure 2:
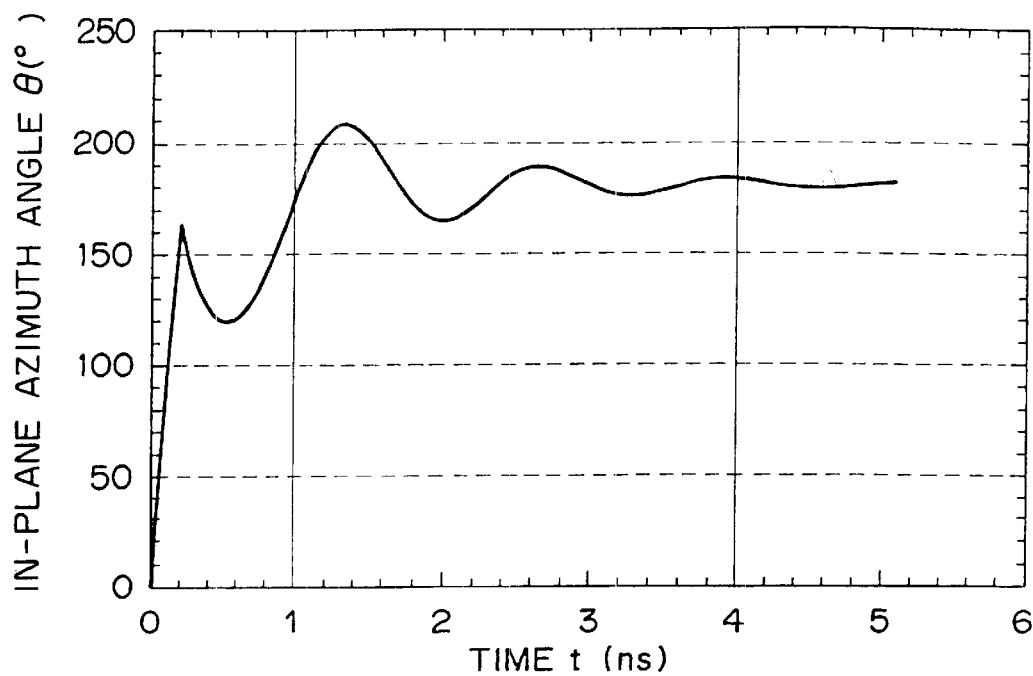
FIG. 2 is a graph showing a result of calculating the locus of a magnetization vector driven by a perpendicular magnetic anisotropy.
Figure 3:
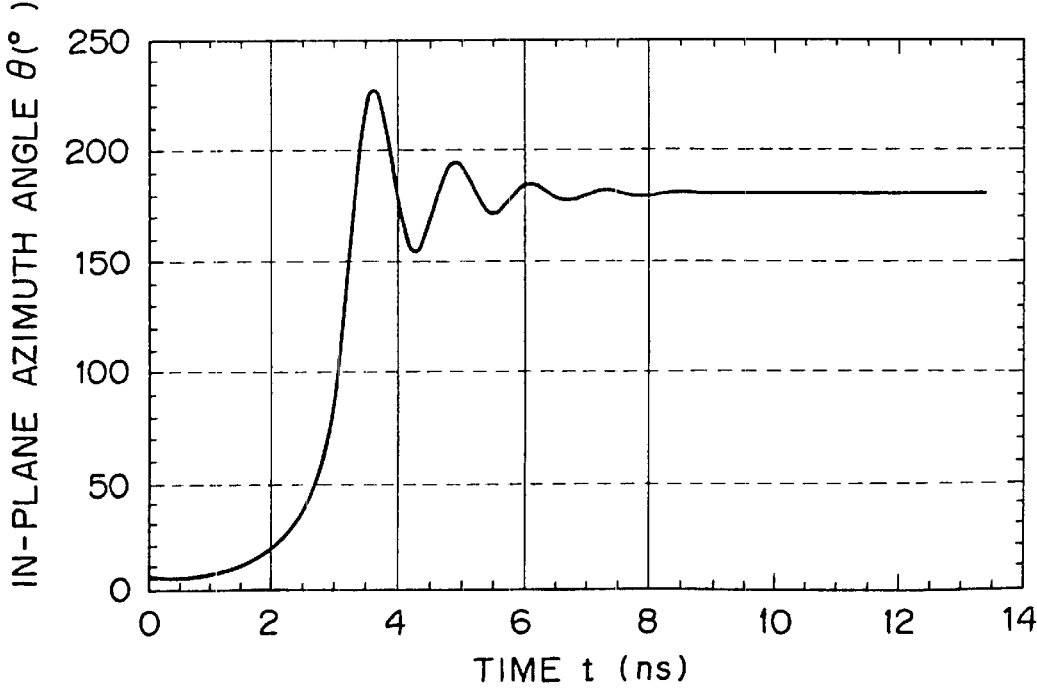
FIG. 3 is a graph showing a result of calculating a magnetization vector driven by a magnetic field applied in parallel to an easy axis of magnetization within a plane.
Figure 4:
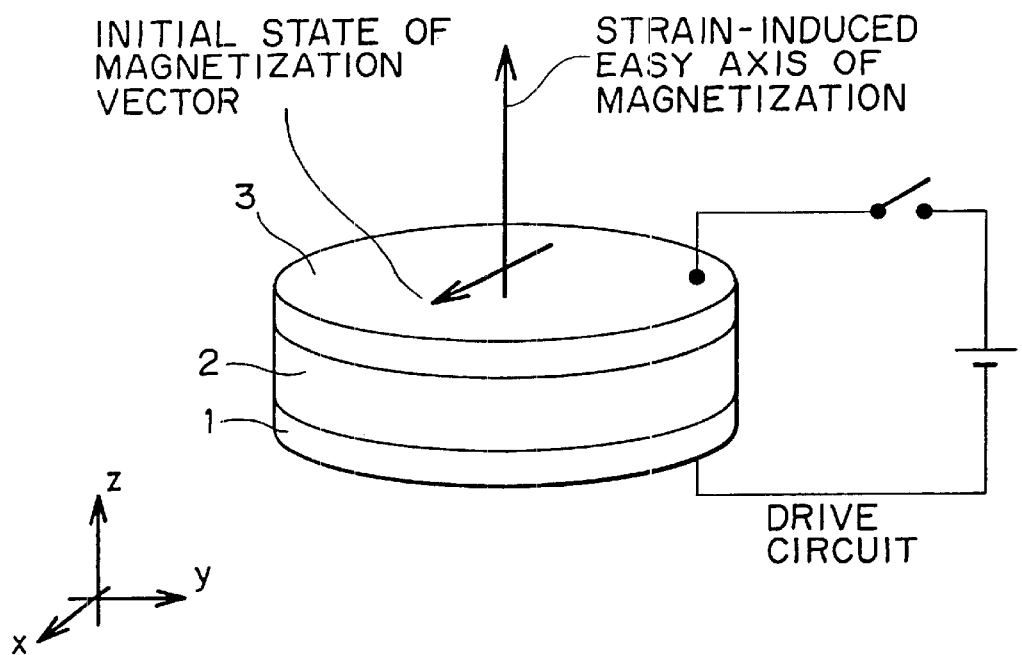
FIG. 4 is a schematic diagram showing a magnetization switching device according to a first embodiment of the present invention.

FIG. 4 shows a magnetization switching device according to a first embodiment of the present invention, which device makes use of a magnetostriction-induced magnetic anisotropy having an easy axis of magnetization directed in the direction nearly perpendicular to that in a static state.

Referring to FIG. 4, the magnetization switching device has a structure in which an electrode layer 1, a piezoelectric layer 2, and a strain sensitive magnetic thin film 3 as an information carrier are stacked in sequence. The strain sensitive magnetic thin film 3 is made from a material having a large magnetostriction capable of changing magnetic anisotropy sensitively due to strain. The electrode layer 1, the piezoelectric layer 2, and the strain sensitive magnetic layer 3 are each formed into a circular shape, and the magnetization switching device has a columnar shape as a whole. In addition, the strain sensitive magnetic thin film 3 serves as an electrode layer.

Examples of the materials used for the piezoelectric layer 2 may include PZT, PLZT, $LiNbO_3$, $LiTaO_3$, ADP, KDP, and ZnO. In the case of forming the piezoelectric material 2 on a substrate, the piezoelectric material 2 may be configured in the form of a combination of piezoelectric material/substrate, or piezoelectric layer/backing thin film/substrate. Examples of such material combinations may include PZT/$SrTiO_3$, PZT/Pt/MgO, PZT/$CeO_2$/Si, PLZT/$SrTiO_3$, PLZT/Pt/MgO, PLZT/$CeO_2$/Si, $BaTiO_3$/$SrTiO_3$, $BaTiO_3$/Pt/MgO, $BaTiO_3$/$CeO_2$/Si, $LiNbO_3$/$Al_2O_3$, $LiNbO_3$/$SrTiO_3$, $LiNbO_3$/$CeO_2$/Si, $LiTaO_3$/$Al_2O_3$, $LiTaO_3$/$SrTiO_3$, $LiTaO_3$/$CeO_2$/Si, ZnO/$Al_2O_3$, ZnO/$Al_2O_3$/Si.

Examples of materials used for the strain sensitive magnetic thin film 3 having an absolute value of magnetostriction may include: alloys each containing a rare earth element, and at least one of Fe, Co, and Ni, examples of which may include $TbFe_2$, $Tb_{70}Fe_{30}$, $Tb_2Fe_{17}$, $Tb(CoFe)_2$, $Tb(NiFe)_2$, SmFe, $ErFe_2$, and $SmFe_3$ (these alloys are particularly large in absolute value of magnetostriction); alloys each containing a platinum group element, and at least one of Fe, Co and Ni, examples of which may include F270Pd30, Fe50Rh50, and Co—Pd (these alloys are excellent in corrosion resistance and high in toughness); oxides, examples of which may include Co ferrite, Ni ferrite, rare earth-iron garnet, and solid-solutions mainly containing the above oxides (these are excellent in corrosion-resistance; however, difficult in preparation of crystals); and other alloys containing at least one of Fe, Co, Ni, and Mn, examples of which may include $Fe_{49}CO_{49}V_2$, Co—Ni, Fe—Al, and Mn—Bi (these alloys are easier in production as compared with oxides).

In one implementation of the magnetization switching device in FIG. 4, the electrode layer 1, an $LiNbO_3$ layer having a thickness of 200 nm used as the piezoelectric layer 2, and a Fe—Rh alloy film having a thickness of 20 nm used as the strain sensitive magnetic thin film 3 are stacked in sequence, and the stack is cut into a circular shape having a diameter of 500 nm.

The operation of the magnetization switching device will be described below. Referring to FIG. 4, a drive circuit is connected between the electrode layer 1 and a strain sensitive magnetic thin film 3 serving as an electrode layer. When a voltage is applied in pulse between the electrode layer 1 and the strain sensitive magnetic thin film 3 via the drive circuit, the piezoelectric layer 2 is, for example, contracted in the direction (z-direction) of the electric field. If crystals forming the piezoelectric layer 2 have a high symmetry of three-fold or more around the z-axis, an equilaterally extensive strain occurs in the piezoelectric layer 2 in the in-plane (XY plane) direction by the above contraction of the piezoelectric layer 2. As a result, a tensile strain equilateral in the xy plane is imparted to the strain sensitive magnetic thin film 3 stacked on the piezoelectric layer 2. In such a state, if the magnetostriction of the strain sensitive magnetic thin film 3 has a large negative value, a stress-induced magnetic anisotropy having an easy axis of magnetization may be directed in the direction perpendicular to the xy plane of the strain sensitive magnetic thin film 3. The perpendicular anisotropy thus generated, which has a function to direct a magnetization vector having a vector component in the +z-direction or −z-direction, contributes to a derivation of an effective magnetic field functioning as a drive force of swing-by switching consistent with the present invention.

Figure 5:
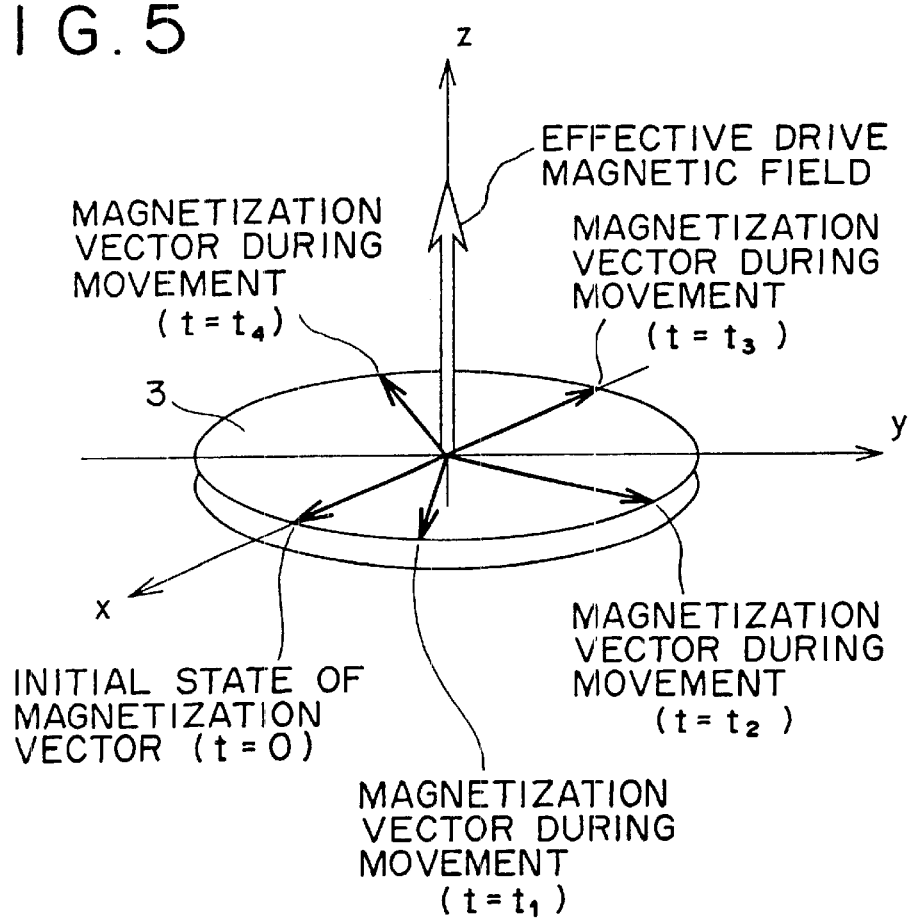
FIG. 5 is a schematic diagram showing the movement of a magnetization vector driven by a perpendicular magnetic anisotropy in the magnetization switching device according to the first embodiment of the present invention.

As described in the equation (1), the change in magnetization vector is proportional to (M×H), and accordingly, if the z-component of the magnetization vector in the initial state is positive, the precession starts on this side as shown in FIG. 5. If the z-component of the magnetization vector in the initial state is negative, the precession starts on the reversed side of the z-component shown in FIG. 5. If the magnetization vector lies perfectly within the xy plane, the effective magnetic field due to the perpendicular magnetic anisotropy does not act. In this case, after a z-component of the magnetization vector occurs due to thermal fluctuation, the magnetization vector undergoes a drive force due to the magnetic anisotropy. Accordingly, in the case of using the magnetic anisotropy as the drive force, to ensure fast switching, it is effective that the magnetization direction is not perfectly perpendicular to the easy axis of magnetization but is tilted therefrom at such an angle to generate a suitable effective field. The tilting of the magnetization direction from the easy axis of magnetization can be realized by providing a bias voltage to the drive circuit thereby offsetting the perpendicular magnetic anisotropy, or making use of a stress generated in the strain sensitive magnetic thin film 3 or crystal magnetic anisotropy of the strain sensitive magnetic film 3 during production of the device.

The voltage supplied from the drive circuit is cut off at the time when the magnetization vector is close to the desired final state (state of $t=t_3$ in FIG. 5), to relax the magnetization vector in the −X direction, thereby completing the magnetization reversal. The magnetization reversal toward the +x direction may be performed by applying the same pulse voltage.

The method of switching the direction of the magnetization vector by using, as the drive force, the strain or stress-induced magnetic anisotropy and the functional device using the switching method, described in this specification, have been already disclosed in the earlier application by the present applicant, Japanese Patent Laid-open No. Hei 11-200840. One aspect of the present invention, however, provides a magnetization switching device that is configured such that the direction of the easy axis of magnetization is changed only by 90° by turning ON/OFF the application of the one-directional strain or changing the sign of the strain (that is, changing the tensile strain from or to compressive strain), and accordingly, switching of the magnetization vector is performed between 0° and 90°. By using the technique disclosed in Japanese Patent Laid-open No. Hei 11-200840, it is possible to realize the storage of binary or more information by directing the magnetization vector in the four directions, 0°, 90°, 180°, and 270°. However, to stably keep the magnetization vector in each of the four directions, it is essential for a magnetic substance of the functional device to ensure the magnetic anisotropy with four-fold symmetry. This is very difficult from the viewpoint of the material technology. On the contrary, the swing-by switching, consistent with the present invention, can realize the switching between 0° and 180° by the drive in the 90° direction. From this viewpoint, the combination of the swing-by switching with the stress (or strain)-induced magnetic function device exhibits a very good advantage.

As described above, according to the first embodiment, a stress-induced magnetic anisotropy is generated in the strain sensitive magnetic thin film 3 by applying, in pulse, a voltage to the piezoelectric layer 2, and a drive force derived by the perpendicular magnetic anisotropy thus generated is applied in pulse in the direction nearly perpendicular to the easy axis of magnetization of the strain sensitive magnetic thin film 3 as the information carrier in the static state, to reverse the direction of the magnetization vector, that is, swing-by switching consistent with the present invention is performed. Accordingly, even if the strain sensitive magnetic thin film 3 is made finer on the order of sub-micron, the swing-by switching can be performed at a high speed without being affected by an insufficient damping to the magnetization vector.

A magnetization switching device according to a second embodiment will be described below.

The magnetization switching device according to the second embodiment has the same structure as that of the magnetization switching device according to the first embodiment, except that a material causing strain (stress)-induced magnetic phase transition is used as the strain sensitive magnetic thin film 3. Examples of the materials causing such a magnetic phase transition may include: (1) metals or compounds causing magnetic phase transition such as Fe—Rh, Mn—Rh, and Cr—S, and (2) oxides causing magnetic phase transition, for example, Mn based perovskites such as $La_{1-x}Sr_xMnO_3$, $Pr_{1-x}Ca_xMnO_3$, and $Nd_{1-x}Sr_xMnO_3$.

As disclosed in Japanese Patent Laid-open No. Hei 11-200840 filed by the present inventor, the function capable of changing the magnetization direction, which is similar to that in the first embodiment, can be realized by imparting a stress or strain to the above-described material causing the strain (stress)-induced magnetic phase transaction.

According to the second embodiment, it is possible to obtain an advantage similar to that obtained by the first embodiment.

Figure 6:
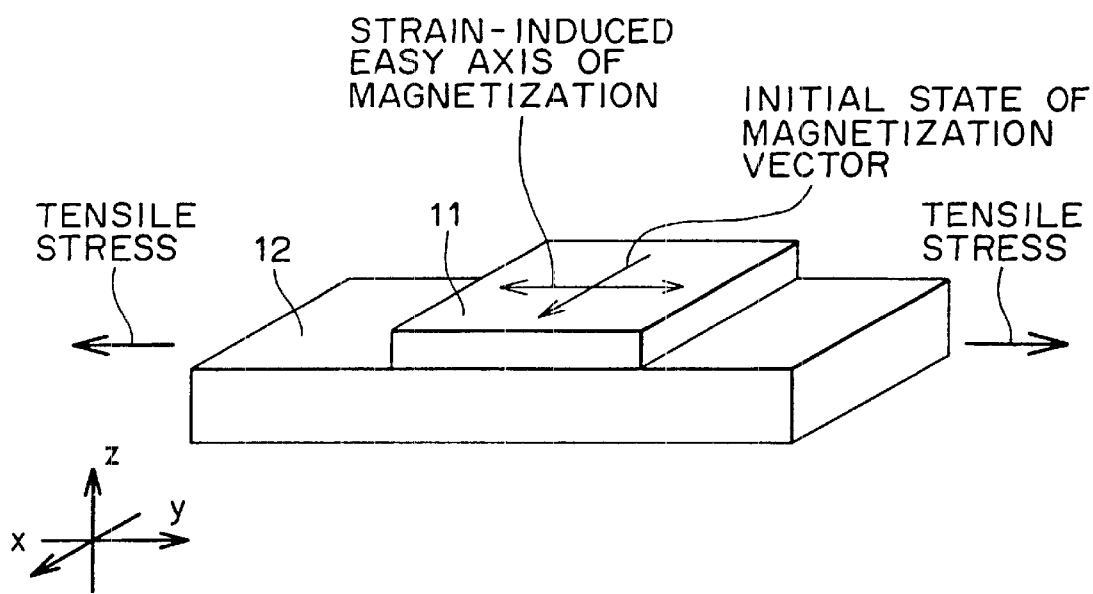
FIG. 6 is a schematic diagram showing a magnetization switching device according to a third embodiment of the present invention.

FIG. 6 shows a magnetization switching device according to a third embodiment, in which an in-plane change in easy axis of magnetization is used as a drive force.

In the implementation shown in FIG. 6, the magnetization switching device includes a strain sensitive magnetic thin film 11 having a large magnetostriction that causes a significantly large change in magnetic anisotropy in response to a strain. The strain sensitive magnetic thin film 11 is used as a magnetic layer to be controlled in this implementation. The strain sensitive magnetic thin film 11 is stacked on a strain imparting layer 12 formed by a piezoelectric substance capable of imparting a strain to the strain sensitive magnetic thin film 11. These strain sensitive magnetic thin film 11 and the strain imparting layer 12 are each formed into a rectangular shape. The rectangular shape having a long side and a short side where the short side has a shape anisotropy which causes a magnetic anisotropy having an easy axis of magnetization in the longitudinal direction. In addition, since a spin distribution at an end portion of a magnetic substance exerts a large effect on the form of magnetization reversal, a shape slightly different from the rectangular shape may be used to control the spin distribution. For example, the result of adopting a shape in which an end portion is obliquely sharpened has been described in a document (A. V. Pohm, J. M. Anderson, R. S. Beech, and J. M. Daughton, J. Appl. Phys. 85, 4771 (1999)).

The strain imparting layer 12 may be made from PZT, $LiNbO_3$, $LiTiO_3$, ADP, KDP, or ZnO, or an inexpensive substrate such as Si, MgO, $Al_2O_3$ or glass in contact with a piezoelectric material or electrostrictive material from which a stress is transmitted to the substrate.

The strain sensitive magnetic thin film 11 having a large absolute value of electrostriction may be made from the same material as that described in the first embodiment.

In one implementation, the strain sensitive magnetic thin film 11 of the magnetization switching device is configured as a Fe—Rh thin film of Ni thin film having a thickness of 20 nm. In this implementation, the film 11 is formed into a rectangular shape of 0.2 $\mu$m×0.05 $\mu$m for allowing the thin film 11 to have a magnetic anisotropy adapted to keep the magnetization direction.

If the magnetostriction of the strain sensitive magnetic thin film 11 is positive, when a uniaxial tensile strain along a certain axis within the plane of the thin film 12 is presented to the strain sensitive magnetic thin film 11, a stress-induced magnetic anisotropy having an easy axis of magnetization along the strain axis occurs as shown in FIG. 6.

The concept in which the above stress-induced magnetic anisotropy is used as a drive force for driving a magnetization vector has been already disclosed in the above-described application by the present applicant, Japanese Patent Laid-open No. Hei 11-200840. On the basis of such a concept, the present invention exhibits the following new advantages: (1) it is possible to realize the high speed operation of a device having a structure made finer on the order of sub-micron; and (2) it is possible to use, as an information carrier, a magnetic material having an uniaxial magnetic anisotropy because the swing-by switching drive method can realize switching between 0° to 180° even by using a stress-induced magnetic anisotropy.

It should be noted that if a magnetization vector is perfectly perpendicular to an easy axis of magnetization, a torque to the magnetization vector does not occur. Accordingly, to obtain an effective drive, the angle between the magnetization vector and the easy axis of magnetization may be adjusted to be less than 90°. In the implementation shown in FIG. 6, the axis of stress imparted by the strain imparting layer 12, which determines the direction of a newly generated easy axis of magnetization, may be adjusted such that the axis of stress is not perfectly perpendicular to or parallel to the easy axis of magnetization of the strain sensitive magnetic thin film 11 in the static state.

The above-described adjustment of the axis of stress may be achieved by changing the position and shape of an electrode (not shown) in contact with the strain imparting layer 12 used for imparting a strain or by selecting the direction of a crystal axis of the piezoelectric substance constituting the strain imparting layer 12. Alternatively, the above adjustment may be achieved by tilting an angle of the easy-axis of magnetization of the strain sensitive magnetic thin film 11 as the magnetic layer to be controlled by suitable combination of magnetic anisotropies (a shape magnetic anisotropy, a crystal magnetic anisotropy, an induced magnetic anisotropy by heat-treatment in a magnetic field, and an induced magnetic anisotropy by deposition in a magnetic field).

According to the third embodiment, there can be obtained an advantage similar to that obtained by the first embodiment.

Figure 7:
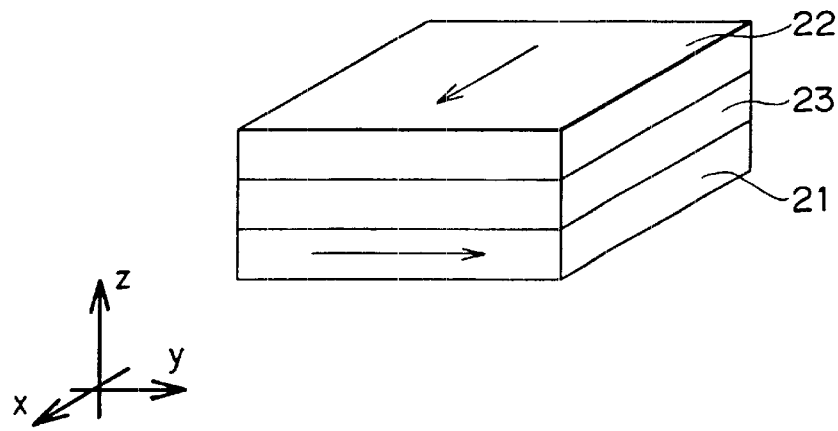
FIG. 7 is a schematic diagram showing a magnetization switching device according to a fourth embodiment of the present invention.

FIG. 7 is a schematic diagram showing a magnetization switching device according to a fourth embodiment of the present invention. The magnetization switching device according to this embodiment includes a main magnetic substance and another magnetic substance disposed adjacently thereto, wherein a drive force derived from an exchange interaction applied from the other magnetic substance to the main magnetic substance is used as a drive force applied substantially perpendicular to a magnetization vector to be switched.

In the implementation shown in FIG. 7, the magnetization switching device has a magnetic layer 22 to be controlled, which functions as an information carrier, stacked on a fixed magnetization layer 21 via an intermediate layer 23. In this implementation, exchange interaction between the magnetic layers 21 and 22, and the strength of the exchange interaction is changed by the effect of a specific layer of the stacked films of the magnetization switching device (the effect of the intermediate layer 23 in this embodiment).

One example of the structure used for driving a magnetization direction of the magnetic layer 22 to be controlled by making use of an exchange coupling between the fixed magnetization layer 21 and the magnetic layer 22 to be controlled will be described below. It should be noted that such a structure has been disclosed in Japanese Patent Laid-open No. Hei 10-185255 filed by the present applicant.

Using Semiconductor Layer as Intermediate Layer 23

In one implementation of a magnetization switching device embodying aspects of the present invention, the intermediate layer 23 is a semiconductor layer. Carriers in a semiconductor in contact with a magnetic substance have a spin density distribution in which the carriers are oscillatingly damped when separated from the magnetic substance, and a magnetic interaction (RKKY interaction) occurs between the carriers and different magnetic ions (or a different magnetic substance) within a distance where a polarization (deviation of the average spin of the carriers from zero) is exerted on the different magnetic ions (or the different magnetic substance). Such an interaction causes an exchange coupling between the two magnetic substances separated from each other with the semiconductor put therebetween. That is to say, in this embodiment, if the intermediate layer 23 is formed by a semiconductor layer, an exchange coupling occurs between the fixed magnetization layer 21 and the magnetic layer 22 to be controlled.

The strength of the magnetic interaction caused between the semiconductor and the different magnetic substance and the frequency of oscillation of the carriers in the semiconductor changed along with the distance from the magnetic substance in contact with the semiconductor are dependent on the carrier density of the semiconductor. The carrier density of the semiconductor can be changed by an external stimulus such as an electric stimulus (application of a voltage, injection of a current, etc.) or light irradiation. Accordingly, the magnetic coupling between the magnetic substance in contact with the semiconductor and the different magnetic substance can be changed by giving an external stimulus to the semiconductor. In this embodiment, by turning on/off a voltage which is applied between the fixed magnetization layer 21 and the magnetic layer 22 to be controlled or an electrode provided separately therefrom, and thereby applied to the intermediate layer 23 configured as the semiconductor layer, it is possible to generate a drive force for reversing a magnetization vector of the magnetic layer 22 to be controlled.

In particular, the magnetic coupling via the semiconductor layer has a possibility that not only the strength of the magnetic coupling but also the positive/negative sign of the magnetic coupling is changed because of the oscillating characteristic of the spin density distribution. That is to say, in the case of the magnetic coupling via the semiconductor layer, there is a possibility that it can be controlled by an external stimulus applied to the semiconductor layer in which states the magnetizations of the upper and lower magnetic layers are easy to be aligned, in parallel (in this case, ferromagnetism occurs) or not in parallel (in this case, (antiferromagnetism occurs).

Using Dielectric Layer as Intermediate Layer 23

In another implementation of a magnetization switching device embodying aspects of the present invention, the intermediate layer 23 is a dielectric layer. An exchange coupling between magnetic layers 21 and 22 can be realized using a dielectric layer as the intermediate layer 23. In this case, the exchange coupling occurs between the magnetic layers 21 and 22 via electrons tunneling between the magnetic layers 21 and 22. Accordingly, in this embodiment, a voltage is applied between the fixed magnetization layer 21 and the magnetic layer 22 to be controlled or an electrode disposed separately therefrom and thereby applied to the intermediate layer 23 configured as the dielectric layer, to change a potential distribution of the stacked layer structure, whereby a tunneling probability of electrons passing through the dielectric layer is changed, with a result that an exchange coupling between the fixed magnetization layer 21 and the magnetic layer 22 to be controlled is changed. Such an exchange coupling between the fixed magnetization layer 21 and the magnetic layer 22 to be controlled can be used as a drive force for reversing a magnetization direction of the magnetic layer 22 to be controlled.

If the intermediate layer 23 is formed by a plurality of dielectric layers, it is of a structure having a plurality of potential barriers. The probability of passing of electrons through the structure having the plurality of potential barriers becomes maximized if electrons have an energy allowing the electrons to resonantly pass through potential wells between the barriers. Accordingly, it is possible to cause a large change in tunneling probability and hence to cause a large change in exchange coupling due to tunneling electrons, by giving a relatively small electric stimulus to the intermediate layer 23 from an external source (not shown in FIG. 7), thereby changing the energy of the electrons or the potential distribution structure between a state in which the electrons resonantly pass through the potential wells between the barriers and a state in which the electrons not resonantly pass through the potential wells between the barriers.

Using Conductive Layer as Intermediate Layer 23

In another implementation of a magnetization switching device embodying aspects of the present invention, the intermediate layer 23 may be a conductive layer comprised of a non-magnetic metal. The above-described RKKY interaction occurs when the intermediate layer 23 is a conductive layer comprised of a non-magnetic metal, allowing a magnetic coupling to be obtained between magnetic layers 21 and 22 with such a conductive layer put therebetween. When the intermediate layer is a conductive layer, however, the number of carriers in the conductor is larger and the relaxation time is shorter, which makes it more difficult to change the number of carriers by an external stimulus as compared with the the embodiment in which the intermediate layer 23 is a semiconductor layer. Thus, it is difficult to modulate the magnetic coupling in the embodiment where the intermediate layer 23 is a conductor layer. Notwithstanding such a disadvantage, it is possible to realize in the embodiment where the intermediate layer 23 is a conductive layer, a substantial modulation of the magnetic coupling by contriving the material structure of the conductive layer.

For example, there can be adopted a material structure in which a stacked film of Cr/(Fe–Ag) is used as the intermediate layer 23. With this material structure, the magnetic coupling between the fixed magnetization layer 21 and the magnetic layer 22 to be controlled can be cut off by supplying a current to the stacked layer of Cr/(Fe—Ag). The method of controlling the magnetic coupling by turning on/off a current has an advantage that the operational speed is not limited to an electric capacity and an insulating material having a high withstand voltage is not required to be used.

Using Composite Material Layer as Intermediate Layer

In another implementation of a magnetization switching device embodying aspects of the present invention, the intermediate layer 23 may be a composite material layer. Even if the intermediate layer 23 between the fixed magnetization layer 21 and the magnetic layer 22 to be controlled is not made from a single material but made from a composite material, the intermediate layer 23 can generate a magnetic coupling between the fixed magnetization layer 21 and the magnetic layer 22 to be controlled. In this case, by giving an external stimulus to the intermediate layer 23, the strength of the magnetic coupling can be controlled.

The intermediate layer 23 may be of a multi-layer structure in which a magnetic layer and a non-ferromagnetic layer are stacked to each other. The magnetic layer may be made from a ferromagnetic metal such as Fe or Cu, or an alloy containing such a ferromagnetic metal and also additionally containing a non-magnetic metal. The non-ferromagnetic layer may be made from a metal selected from a very wide material range, such as Ti, V, Mn, Cu, Zr, Nb, Mo, Ru, Rh, Pd, Ag, Hf, Ta, W, Re, Ir, Pt, or Au. In addition, Cr exhibiting antiferromagnetism at room temperature can be used for the non-ferromagnetic layer. The kind of the magnetic coupling (ferromagnetic coupling or antiferromagnetic coupling) and the strength of the magnetic coupling can be variously designed by changing the kind of a magnetic substance to be stacked to the intermediate layer or thickness of the non-ferromagnetic layer.

The intermediate layer 23 may be formed by a fine-particle dispersion structure, typically, in which ferromagnetic fine-particles of Fe or the like are dispersed in a non-magnetic substance made from Ag or the like. In the case of adopting this structure, the fixed magnetization layer 21 and the magnetic layer 22 to be controlled with the intermediate layer 23 put therebetween are magnetically coupled to each other by way of the ferromagnetic fine-particles dispersed as steppingstones in the intermediate layer 23.

When a current flows in the intermediate layer 23, respective magnetic couplings between the ferromagnetic fine particles, which are very weak, tend to be cutoff due to excessive scattering of electrons and temperature rise. Accordingly, in the case where the intermediate layer 23 having the fine-particle dispersion structure is disposed between the fixed magnetization layer 21 and the magnetic layer 22 to be controlled, the magnetic coupling between the fixed magnetization layer 21 and the magnetic layer 22 to be controlled is dependent on the weak magnetic couplings between the ferromagnetic fine-particles and tends to be cut off by a current flowing in the intermediate layer 23.

The fine-particle dispersion structure may be adopted as a structure of one of a plurality of components of the stacked layer structure. For example, the Fe—Ag film stacked to the Cr film, described above, is made from a material in which two non-soluble phases are mixed, and therefore, strictly speaking, it has a fine-particle dispersion structure.

In the case of using a composite material including a magnetic substance as the intermediate layer 23, since a magnetic coupling indirectly occurs via the magnetic substance in the composite material, the thickness of the intermediate layer 23 can be made relatively thick, and preferably set at 10 nm or more. By setting the thickness of the intermediate layer 23 at 10 nm or more, it is possible to avoid a problem associated with the difficulty in production of the intermediate layer 23 because of the excessively thin thickness thereof.

The upper limit of the thickness of the intermediate layer 23 made from a composite material including a magnetic substance is not particularly limited; however, from the viewpoint of practical production, the thickness of the intermediate layer 23 is preferably in a range of about 1 $\mu$m or less.

Using Different Magnetic Substance as Intermediate Layer 23

A material having a relative low Curie temperature at which a magnetic order disappears or a ferrimagnetic material in a state near a compensation point can significantly change a macro magnetic characteristic by an external stimulus. Such a material can be used for modulating a magnetic coupling between magnetic layers, that is, the fixed magnetization layer 21 and the magnetic layer 22 to be controlled.

One example of a method of producing the magnetization switching device according to the fourth embodiment will be described below. The intermediate layer 23 of the magnetization switching device used for the production method may be a conductive layer.

In this example, a high coercive force Co—Pt magnetic layer (permanent magnet layer) having a thickness of 100 nm and a Co layer having a thickness of 100 nm are sequentially deposited on a glass substrate by sputtering, to form a fixed magnetization layer 21.

To form the intermediate layer 23 in this example, a Cr/(Fe—Ag) multi-layer film is deposited on the fixed magnetization layer 21 by sputtering. To be more specific, a Fe—Ag mosaic target (six Ag plates each formed into a fan-shape opened at a center angle of 15° are arranged on a Fe target) and a Cr target are simultaneously sputtered and the substrate is moved in such a manner as to alternately face to respective targets, to deposit the Cr/(Fe—Ag) multi layer film at room temperature. The thickness of the Cr film is set at 0.9 nm, and the thickness of the Fe—Ag film is set at 1.5 nm. The Fe—Ag film is first deposited on the above ferrite thin film, followed by deposition of 16.5 cycles, each cycle being composed of the Cr-film and the Fe—Ag film, and the Fe—Ag film is finally deposited. As described above, the Cr/(Fe—Ag) multi-layer film functions to cut off the magnetic coupling when a current flows. In actual, an electrode pad is formed at an outer peripheral portion of the device region for ensuring an electrode for supplying a current to the intermediate layer 24.

An insulation connecting layer is deposited on the intermediate layer 23 by sputtering in such a manner as not to cover the electrode pad led from the intermediate layer 23.

To form the magnetic layer 22 to be controlled (memory carrier) in this example, a Ni—Fe layer is deposited on the insulation connecting layer by sputtering. During deposition, a magnetic bias transferred from the underlying layer is removed by heating the substrate, and an external magnetic field is applied in the −x direction, to give an uniaxial magnetic anisotropy having an easy axis in the x direction.

A resist pattern having a specific shape is formed on the magnetic layer 22 to be controlled. The magnetic layer 22 to be controlled, the intermediate layer 23, and the fixed magnetization layer 21 are sequentially etched by dry etching, to be patterned into a shape of the memory carrier. The patterning may be performed by using a so-called lift-off process.

A magnetic field of 2 kOe is applied in the x direction at room temperature by using an electric magnet, to align the magnetization direction of each of the high coercive force Co—Pt magnetic layer and Co layer in the −x direction.

In this way, a magnetization switching device embodying the present invention may be produced.

As compared with the configuration making use of stress-induced magnetic anisotropy described in the first and third embodiments, the fourth embodiment is advantageous in that the drive force in a determined direction can be used like the case of applying an external magnetic field. To be more specific, the energy $-E_{ex}$ of exchange interaction is expressed by $E_{ex} = J \cdot \cos(\varphi - \varphi_f)$ where J is a positive or negative constant, which equation is a function of primary degree of cosine, while the energy $E_a$ of uniaxial magnetic anisotropy is expressed by $E_a = -Ku \cdot \cos^2(\varphi - \varphi_e)$ where Ku is a positive constant, which equation is a function of secondary degree of cosine. In these equations, $\varphi$ is an azimuth angle of a magnetization vector of the magnetic layer to be controlled; $\varphi_f$ is an azimuth angle of a magnetization vector of the fixed magnetization layer; and $\varphi_e$ is an azimuth angle of an easy axis of magnetization. In the swing-by switching drive method, since the drive force is applied in the direction nearly perpendicular to the magnetization vector, the value $\varphi - \varphi_e$ or $\varphi - \varphi_f$ becomes close to 90°. Accordingly, in the case of using the magnetic anisotropy having the energy expressed by $E_a = -Ku \cdot \cos^2(\varphi - \varphi_e)$, the torque given to the magnetization vector by the energy gradient dE/dt is close to the minimum value, and the sign (direction) of the torque may be not fixed. On the contrary, in the case of using the exchange interaction having the energy expressed by $E_{ex} = J \cdot \cos(\varphi - \varphi_f)$, the value of the energy gradient dE/d$\varphi$ close to the maximum value can be utilized.

According to the fourth embodiment, there can be obtained an advantage similar to that obtained by the first embodiment.

Figure 8:
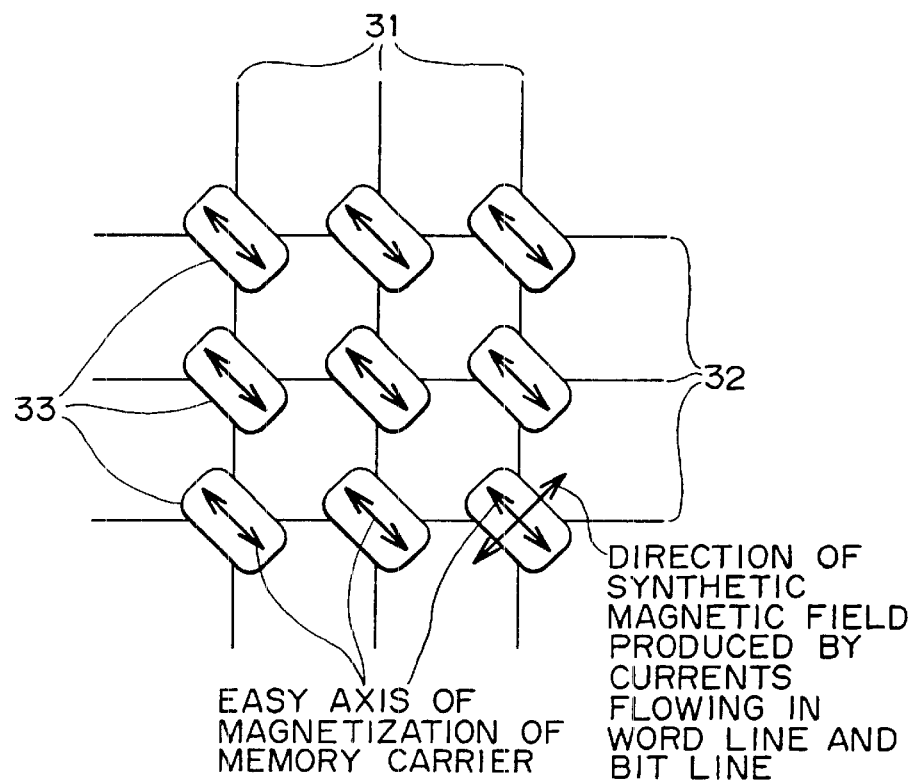
FIG. 8 is a schematic diagram showing a magnetization switching device according to a fifth embodiment of the present invention.

FIG. 8 shows an MRAM according to the fifth embodiment, which MRAM is driven by a magnetic field in a direction perpendicular to an easy axis of magnetization.

As shown in FIG. 8, the MRAM includes longitudinal lines and lateral lines, that is, word lines 31 and bit lines 32, which are formed on a substrate (not shown), and magnetic thin film portions located at the intersections, that is, lattice points between the lines 31 and 32. These magnetic thin film portions arranged in a matrix pattern are taken as memory carriers 33. In this MRAM, normal and reversal magnetization directions of each of the memory carriers 33 are set at the states "0" and "1", respectively, to perform binary storage.

In the related art MRAM, the writing operation to reverse the magnetization direction is performed by using a synthetic magnetic field formed by currents flowing in the word lines and bit lines. That is to say, only one of the memory carriers, which is located at an intersection between one of the longitudinal lines, that is, the word lines through which a current flows and one of the lateral lines, that is, the bit lines through which a current flows, undergoes a synthetic magnetic field, and accordingly, only the magnetization of the memory carrier can be selectively reversed.

In general, a magnetic thin film having a rectangular shape in which the size of both the long side and short side is on the order of 1 μm is used as the memory carrier, to obtain an uniaxial magnetic anisotropy by the shape anisotropy of the rectangular magnetic thin film. The memory carrier is often disposed with its easy axis of magnetization being in parallel to one of longitudinal and lateral lines, wherein the magnetization reversal of the memory carrier is performed by applying a synthetic magnetic field in the direction tilted by about 135° with respect to the magnetization vector directed in the easy axis of magnetization. It is known that the switching by applying a magnetic field in the direction tilted at a certain angle with respect to a magnetization vector is superior to the switching by applying a magnetic field in the direction 180° reversed with respect to a magnetization vector in terms of enhancing an operational speed. Even in the above device driven by a magnetic field, if the structure of the device becomes finer, the speed of magnetization reversal becomes slow because of an insufficient damping of the magnetization vector.

To increase the operational speed of such an MRAM having a finer-structure, such as a sub-micron structure, driven by a magnetic field, the swing-by switching consistent with methods and devices of the present invention can be applied to the MRAM as shown in FIG. 8. That is to say, an easy axis of magnetization of each memory carrier 33 formed by the magnetic thin film may be aligned in the direction tilted by about 45° with respect to the longitudinal lines and lateral lines, that is the word lines 31 and bit lines 32. With this configuration, a synthetic magnetic field produced by the lines 31 and 32 is applied in the direction tilted by about 90° with respect to the magnetization vector of the memory carrier 33.

In this embodiment, the drive force may be driven for a substantially short time, which is equivalent to a small fraction of the time required for magnetization reversal. The reason for this is as follows: A magnetic field generated only by a current flowing in one of the longitudinal line and the lateral line is smaller than a synthetic magnetic field generated by currents flowing in both the lines; however, since the magnetic field generated only by a current flowing in one line, which is applied in the direction tilted by 45° or 135° with respect to the easy axis of magnetization of the memory carrier 33, effectively acts as a drive force to drive a slower static magnetic magnetization. If such a magnetic field is applied for a predetermined period of time or more, the magnetization vectors of all of the memory carriers 33 located along one line in which the current flows may be aligned in one direction, tending to obstruct the selective writing.

The magnetic thin film constituting the memory carrier 33 may be represented by a $Ni_{80}Fe_{20}$ alloy thin film having a size of 0.25 μm×0.1 μm and a thickness of 10 nm, to which a magnetic anisotropy with an easy axis of magnetization directed in the longitudinal direction is given by film formation in a magnetic field or rectangular shape.

According to the fifth embodiment, which has an advantage similar to that of the first embodiment, an MRAM consistent with the present invention may be produced that is operable at a high speed.

Figure 9:
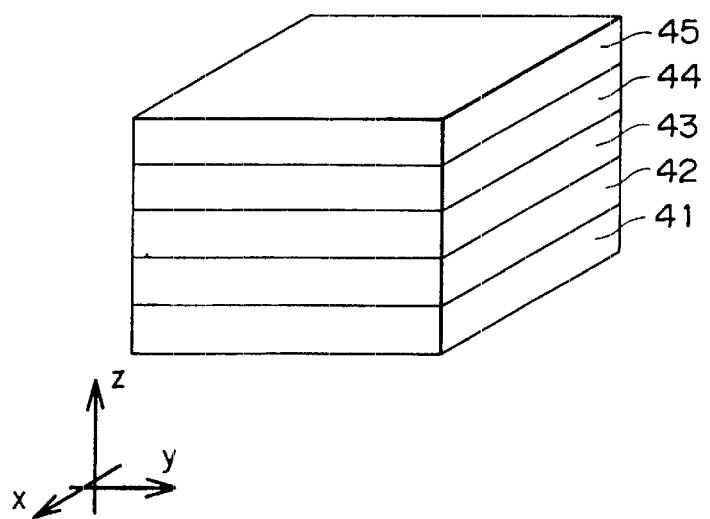
FIG. 9 is a schematic diagram showing a magnetization switching device according to a sixth embodiment of the present invention.

FIG. 9 shows a magnetization switching device according to a sixth embodiment of the present invention.

To make effective use of the swing-by switching consistent with the present invention, magnetic layers constituting a device, particularly, a magnetic layer to be controlled as a memory carrier in which switching occurs must have suitable magnetic characteristics. To be more specific, the saturation magnetization, magnetostriction, magnetic anisotropy, and direction of an easy axis of magnetization with respect to the drive structure of a magnetic thin film are required to be in suitable ranges, respectively. It is difficult to obtain a material capable of simultaneously satisfying the above-described parameters only by changing the composition of the material.

The magnetic characteristics required for design of a device can be given to a magnetic thin film by making the magnetic thin film have a multi-layer structure including a plurality of layers. Magnetic characteristics required for design of a device, for example, a magnetostriction causing a stress-induced magnetic anisotropy used as a drive force for driving magnetization reversal and a magnetic anisotropy can be independently controlled by stacking a suitable thickness of a magnetic thin layer having a large magnetostriction to a suitable thickness of a magnetic thin film having a large magnetic anisotropy allowing the establishment of the direction of an easy axis of magnetization.

For this purpose, as shown in FIG. 9, the magnetization switching device according to the sixth embodiment has a structure in which a strain imparting layer 41, a strain sensitive magnetic layer 42, an anisotropy imparting layer 43, a connection control layer 44, and a fixed magnetization layer 45 are sequentially stacked to each other. In this stacked structure, the magnetizations of the strain sensitive magnetic layer 42 and the anisotropy imparting layer 43 at a central portion of the stacked structure are ferromagnetically aligned, to be moved as one magnetization vector. That is to say, these layers 42 and 43 function as a composite magnetic layer to be controlled.

It is important to give a suitable magnetic anisotropy to the magnetic layer to be controlled in order not only to increase the switching speed but also to stably keep a magnetization direction of the magnetic layer in the static state thereby realizing a non-volatile memory operation.

The strain imparting layer 41 has a function similar to that of the strain imparting layer 12 in the third embodiment, and may be made from a material similar to that used for the strain imparting layer 12. The connection control layer 44 has a function similar to that of the intermediate layer 23 in the fourth embodiment.

In this magnetization switching device, when a strain imparted by the strain imparting layer 41 made from a piezoelectric substance is changed, the magnetization direction of the strain sensitive magnetic layer 42 having a large magnetostriction is changed. The composite magnetic layer to be controlled is designed such that when the strain state is returned to the original, the magnetization is not reversibly returned, to certainly hold the information obtained by the change in magnetization direction. That is to say, the composite magnetic layer to be controlled, which is formed in contact with the strain imparting layer 41, is composed of the strain sensitive magnetic layer 42 capable of converting a strain into a change in magnetic characteristic, and the anisotropy imparting layer 43 capable of imparting a magnetic anisotropy for assisting the holding and storing the magnetization state.

The magnetic anisotropy of the strain sensitive magnetic layer 42 is changed when it receives a large strain from the strain imparting layer 41, and the magnetization of the anisotropy imparting layer 43 connected to the strain sensitive magnetic layer 42 also receives a rotational drive force. When the strain becomes small, the magnetization of the strain sensitive magnetic layer 42 is kept in either of the easy axes of magnetization because the anisotropy imparting layer 43 has a predetermined anisotropy. In this way, a non-volatile storage can be achieved.

As an example of the composite magnetic layer to be controlled (e.g., layers 42 and 43), the anisotropy imparting layer 43 may be comprised of a Fe (211) thin film having a thickness of 10 nm grown on a MgO (110) substrate, and the strain sensitive magnetic layer 42 may be comprised of an Ni layer having a thickness of 25 nm, which is stacked on the anisotropy imparting layer 43. The strain is applied to the entire Ni/Fe stack on the MgO substrate by distorting the MgO substrate.

According to this implementation of a magnetization switching device embodying the present invention, a strain is exerted on the composite magnetic layer (e.g., layers 42 and 43) to be controlled at the center portion from the lower side strain imparting layer 41, and an exchange coupling is exerted on the composite magnetic layer to be controlled from the upper side fixed magnetization layer 45 via the connection control layer 44. That is to say, the composite magnetic layer to be controlled (e.g., layers 42 and 43) undergoes the two drive forces. The combination of a plurality of drive forces in the coordinate and the competition relationships with each other functions as means capable of realizing a random-access operation causing selective magnetization reversal for only one of many devices which are disposed in a matrix pattern to form an apparatus, or functions as means constituting a logic gate such as an AND gate responding only in the case where two inputs are simultaneously in the ON states.

As repeatedly described above, for the swing-by switching, it is important to give a drive force in the direction nearly perpendicular to a magnetization vector to be controlled. As the feature of this embodiment, the stacked structure includes a combination of the layers, in which magnetization vectors are disposed along easy axes of magnetization crossing each other at 90°, just as the fixed magnetization layer 45 and the anisotropy imparting layer 43.

In one implementation of the magnetization switching device shown in FIG. 9, an LiNbO$_3$ thin film having a thickness of 150 nm is used as the strain imparting layer 41; a Fe—Rh alloy film having a thickness of 20 nm is used as the strain sensitive magnetic layer 42; an Ni$_{80}$Fe$_{20}$ alloy thin film having a thickness of 10 nm, which is given an uniaxial magnetic anisotropy by deposition in a magnetic field is used as the anisotropy imparting layer 43; and a Co thin film having a thickness of 10 nm with c-axes aligned in one direction within a plane is used as the fixed magnetization layer 45. In addition, the connection control layer 44 may be the same as the intermediate layer 23 in the fourth embodiment.

According to the sixth embodiment, there can be obtained an advantage similar to that obtained in the first embodiment. Furthermore, since the device in this embodiment is driven based on a combination of a plurality of inputs, it is suitable for configuration of a logic gate and for realization of an address function.

Figure 10:
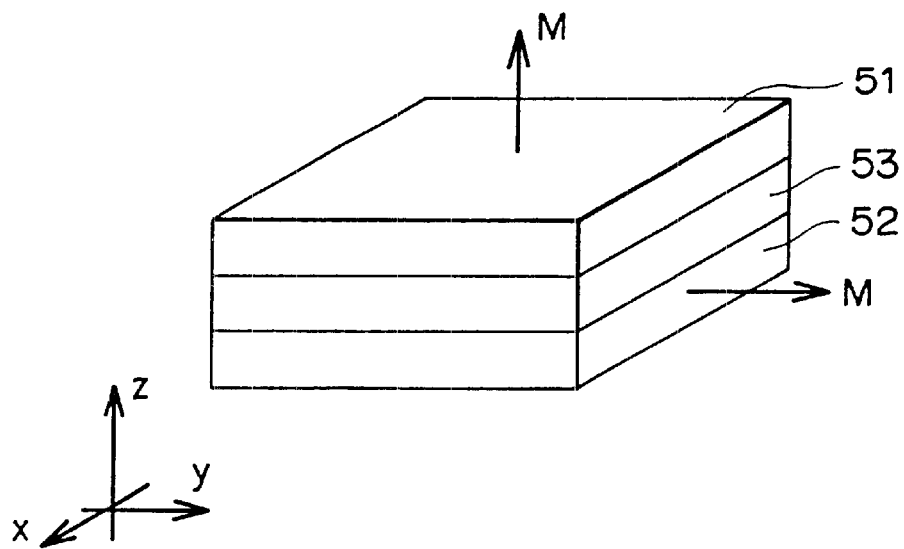
FIG. 10 is a schematic diagram showing a magnetization switching device according to a seventh embodiment of the present invention.

FIG. 10 shows a magnetization switching device according to a seventh embodiment of the present invention.

The swing-by switching in this embodiment of the present invention is characterized in a three-dimensional arrangement where a vertical drive force may be provided to a plane of the three-dimensional arrangement that has a magnetization vector in the process of magnetization reversal. Accordingly, it is useful that the three-dimensional arrangement comprises a stacked film having a perpendicular magnetization film such as Co/Pt stacked film or a Tb-fe alloy metal.

According to the seventh embodiment, as shown in FIG. 10, a perpendicular magnetization film having a magnetization direction upward (+Z) or downward (−z) from a film plane in the static state is used as a magnetic layer 51 to be controlled, and a fixed magnetization layer 52 having a magnetization directed in the y direction within a plane is coupled to the magnetic layer 51 to be controlled via a connection control layer 53. A magnetization vector of the magnetic layer 51 to be controlled is turned within the xz plane with an exchange interaction, received by the magnetic layer 51 to be controlled as a drive force.

The configuration in this embodiment may be modified such that a fixed magnetization layer 52 formed by a perpendicular magnetization film having a magnetization direct in the z direction is coupled to a magnetic layer 51 to be controlled which has an easy axis of magnetization in the x direction and has a magnetization vector in the x direction within a plane in the static state, wherein the magnetization vector of the magnetic layer 51 to be controlled is turned within the xy plane.

In a configuration in which the magnetization vector of a magnetic layer 51 to be controlled which has an easy axis of magnetization directed in the x direction is turned within the xz plane by a drive force directed in the y direction, a perpendicular magnetization film may be supplementarily coupled to the magnetic layer 51 to be controlled. In this case, the perpendicular magnetization film functions to reduce a resisting force received from demagnetization field upon the rise of the magnetization vector in the z direction and to assist the termination of the magnetization vector within the xz plane.

Further, in the first embodiment in which the stress-induced magnetic anisotropy in the vertical direction is used as a drive force, in order to obtain an effective drive by slightly raising the magnetization vector of the magnetic layer to be controlled in the initial state from the film plane, a perpendicular magnetization film may be stacked on the magnetic layer to be controlled.

As described above, the perpendicular magnetization film can be used in order to (1) determine a basic magnetic anisotropy of the magnetic layer to be controlled, to (2) determine a magnetic anisotropy or a magnetization direction, for example, of the fixed magnetization layer causing a drive force, and to (3) assist a basic element, typically, the magnetic layer to be controlled, to improve the device characteristic.

As an structural example of the magnetic switching device in this embodiment, a multi-layer film composed of 10 cycles of Co (0.38 nm)/Pt (0.62 nm) is used as the magnetic layer 51 to be controlled, and a Co thin film with c-axes aligned in one direction within a plane is used as the fixed magnetization layer 52. In addition, the connection control layer 53 may be the same as the intermediate layer 23 in the fourth embodiment.

In the case of using a stress as a drive force without provision of the connection control layer 53, a material having a large magnetostriction causing a perpendicular magnetic anisotropy, for example, a Tb—Fe alloy is used as the magnetic layer 51 to be controlled.

According to the seventh embodiment, there can be obtained an advantage similar to that obtained by the first embodiment.

Figure 11:
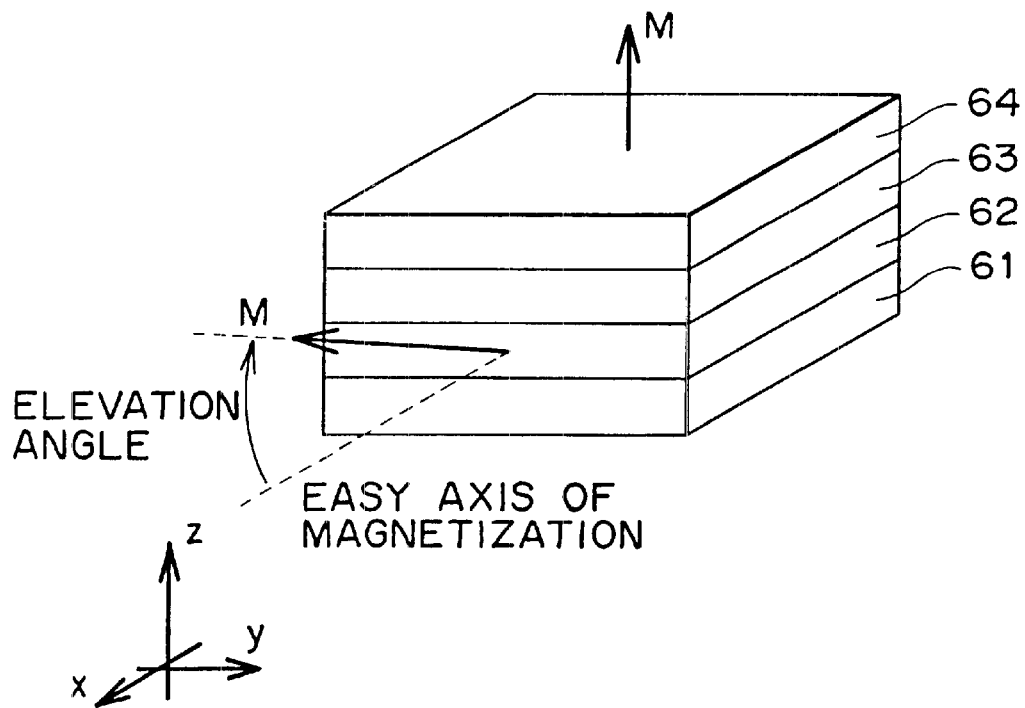
FIG. 11 is a schematic diagram showing a magnetization switching device according to an eighth embodiment of the present invention.

FIG. 11 shows a magnetization switching device according to an eighth embodiment.

In this embodiment, a drive force for driving a magnetization vector has a directivity or axiality. To be more specific, an exchange biasing from an external magnetic field or a fixed magnetization layer, which usually acts to drive the N-pole of the magnetization to be controlled in one direction, has a directivity. On the contrary, for example, in the case of a stress-induced magnetic anisotropy, the N-pole of a magnetization to be controlled is drawn in the positive direction (typically, +z direction) or the negative direction (−z direction) of an easy axis of magnetization of the stress-induced magnetic anisotropy depending on the initial state. In other words, the magnetization vector may be moved along the easy axis of magnetization of the stress-induced magnetic anisotropy. Accordingly, the stress-induced magnetic anisotropy has an axiality.

When a magnetization vector undergoes the effect of a magnetic anisotropy having an easy axis of magnetization directed in the direction perpendicular to the magnetization vector, the torque M×H in the equation (1) becomes zero, to cause a state that it is not determined in which direction the N-pole is drawn, positive direction or negative direction of the easy axis of magnetization. This has been already described in the fourth embodiment. When the magnetization vector is tilted by thermal fluctuation or the like, a torque to turn the magnetization vector in a certain direction is given to the magnetization vector. The fact that the direction of the torque is unstable means that the direction of the precession used for the swing-by switching is also unstable.

To prevent the operation of a device from being affected by fluctuation, it is desirable to solve the above-described inconvenience. Further, to obtain a quick rise of magnetization reversal, the start-up of the movement of the magnetization vector in the state that the torque M×H is zero should be avoided.

The specific countermeasures to prevent a magnetization vector in the initial state from crossing an easy axis of magnetization at right angles have been described in the first and third embodiments. According to the eighth embodiment, a general method for solving such a problem by making use of a stacked structure will be described.

As shown in FIG. 11, the magnetization switching device according to this embodiment has a structure in which a strain imparting layer 61, a magnetic layer 62 to be controlled which is formed by a strain sensitive magnetic layer, a connection medium layer 63, and a fixed magnetization layer 64 as an anisotropy imparting layer are sequentially stacked.

The strain imparting layer 61 may be the same as that used in each of the third and six embodiments. The magnetic layer 62 to be controlled may be the same as that used in each of the first, third and sixth embodiments. The connection medium layer 63 may be the same as the connection control layer used in each of the fourth, sixth and seventh embodiments. The fixed magnetization layer 64 may be the same as that used in the seventh embodiment.

In this magnetization switching device, a magnetization vector of the magnetic layer 62 to be controlled which is formed by the strain sensitive magnetic layer having a large magnetostriction receives an in-plane uniform strain from the strain imparting layer 61 and is driven by a stressinducted magnetic anisotropy having an easy axis of magnification directed in the z direction. The magnetic layer 62 to be controlled has an easy axis of magnetization directed in parallel to the x-axis in the static state, and a magnetization vector thereof in the static state is settled while being directed upwardly by an exchange biasing from the fixed magnetization layer 64 weakly coupled to the magnetic layer 63 to be controlled via the connection medium layer 63, whereby the torque M×H can be necessarily directed in a determined direction upon start-up of movement of the magnetization vector.

If a suitable coupling can be established at an interface between the fixed magnetization layer 64 and the magnetic layer 62 to be controlled, the connection medium layer 63 may be omitted. Further, the fixed magnetization layer 64 may be replaced with an anisotropy imparting layer which is strongly coupled with the magnetic layer 62 to be controlled for imparting a perpendicular magnetic anisotropy. Magnetizations of both the layers are directed slightly upwardly from the x-axis in the static state and are moved in parallel to each other upon driving.

The magnetic layer assembled to the magnetic layer 62 to be controlled for adjusting such an angular relationship is not limited to the above-described perpendicular magnetization film but may be an in-plane magnetization film, and more generally, may be a magnetic thin film having an easy axis of magnetization or a fixed magnetization tilted outwardly from the film plane.

The above-described tilt angle of magnetization will be described in detail below.

A combination of magnetic anisotropies necessary for a magnetization vector receiving a switching drive torque in the direction perpendicular to a thin film plane to be tilted upwardly from the film plane is as follows:

In a magnetic film having a perpendicular anisotropy constant $K_p$, an energy E ($\psi$) at the time when a magnetization vector is tilted from a film plane at an elevation angle $\psi$ is given by $$E(\psi) = v(2\pi m_s^2 - Kp)\sin^2 \psi$$

where v is a volume of the magnetic thin film. If the term $(2\pi M_s^2 - Kp)$ is positive, a stable position of the minimum energy is within a plane ($\psi=0$), and if the term $(2\pi M_s^2 - Kp)$ is negative, the magnetic thin film becomes a perpendicular magnetization film.

The magnetic vector of the in-plane magnetization film is thermally fluctuated in the vertical direction of the thin film plane, and the energy thereof is on the order of kT where k is a Boltzman's constant, and T is an absolute temperature. If a tilt angle larger than the maximum amplitude of the thermal fluctuation is given, the magnetization vector can be settled on one side of the thin film surface. Such a necessary tilt angle can be obtained as follows:

$$kT = v(2\pi M_s^2 - Kp)\sin^2 \psi_{max}$$

where $\psi_{max}$ is the maximum angle allowing oscillation with an energy of kT.

Accordingly, $\psi_{max}$ can be expressed by the following equation:

$$\psi_{max} = \sin^{-1}\{[kT/v(2\pi M_s^2 - K_p)]^{1/2}$$

As a result, a tilt angle equal to or more than the maximum angle $\psi_{max}$ may be given to settle the magnetization vector on one side of the thin film surface.

The tilt angle will be estimated by example of an $Ni_{80}Fe_{20}$ alloy in which the perpendicular magnetic anisotropy constant $K_p$ is negligible as compared with the shape anisotropy $2\pi M_s^2$. For a pattern of the Ni—Fe alloy having a saturation magnetization $M_s=10^4$(G) at a temperature of 300 K and also having a size of 100 nm×50 nm×10 nm, the deflection angle opened outwardly from the film plane, which is caused by thermal fluctuation, becomes 0.83°. Even if the size of the pattern is reduced to a size of 50 nm×25 nm×5 nm, the deflection angle does not exceed 2.4°. Accordingly, the tilt angle may be set at a value sufficiently larger than 2.4°, for example, at about 5°.

To give the tilt angle thus obtained to the magnetic layer 62 to be controlled, which is formed by an in-plane magnetization film having a small $K_p$, a perpendicular magnetization film having a large $K_p$ may be coupled with the magnetic layer 62 to be controlled. In general, if two ferromagnetic layers are stacked to each other, an exchange energy $E_{ex}$ occurs, which energy is lowered when the magnetization directions of the layers are in parallel to each other, tending to align the magnetizations of the layers.

The exchange energy $E_{ex}$ can be expressed by $$E_{ex} \text{ and } J_{ex} \cos(\psi_1 - \psi_2)$$

where $J_{ex}$ is an exchange constant between two layers, and $\psi_1$ and $\psi_2$ are elevation angles of magnetizations of respective layers.

If the value of $J_{ex}$ is significantly large, $\psi_1$ and $\psi_2$ are nearly equal to each other, and thereby the total energy of the layers dependents on the tilt angle as shown by the above-described equation of E ($\psi$)=v $(2\pi M_s^2 - K_p)\sin^2 \psi$. That is to say, the minimum energy appears only within the film plane or in the direction perpendicular to the film plane. Accordingly, to give a tilt angle being not at 0° or 90°, a suitable weak value of $J_{ex}$ so that $\psi_1$ and $\psi_2$ are not perfectly equal to each other.

A suitable weak value of $J_{ex}$ can be obtained by making weak the coupling between the two ferromagnetic layers with the aid of the following means. For example, both the layers are not directly brought into contact with each other but may be indirectly brought into contact with each other via the connection medium layer 63. The provision of the connection medium layer 52 adjusts the coupling between both the layers. Concretely, a non-magnetic metal such as Ti or Cu is inserted at the interface between both the layers at a covering ratio of one atomic layer or less in order to make weak the exchange coupling between the layers. Alternatively, the exchange coupling between layers can be made weak by temporarily introducing oxygen upon sequential stacking of both the layers in a vacuum vessel, to oxide the interface between the layers and its neighborhood.

The fixed magnetization layer 64 may be formed by a Co thin film with C-axes aligned in one direction within a plane, or an antiferromagnetic substance less affected by an external environment such as NiMn, FeMn or NiO.

According to the eighth embodiment of the present invention, there can be obtained an advantage similar to that obtained by the first embodiment.

Figure 12:
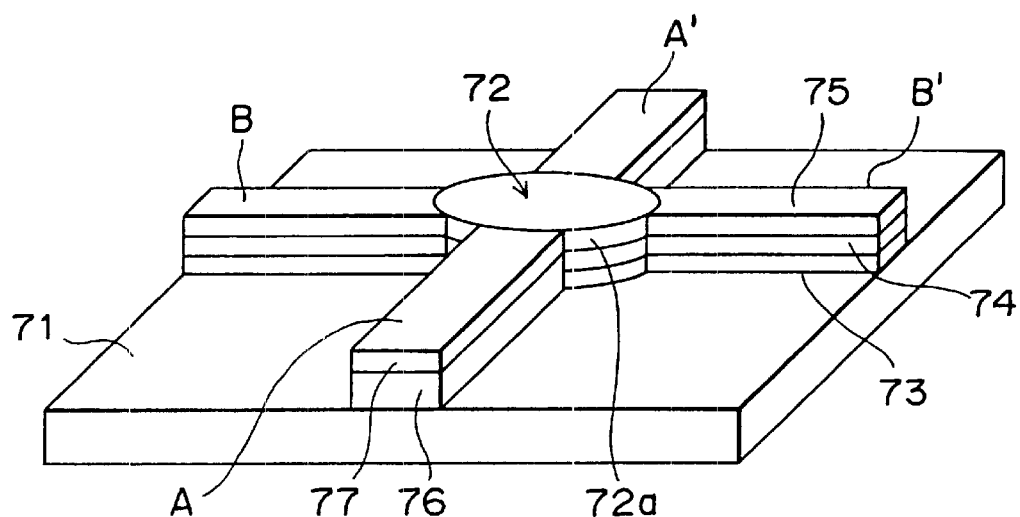
FIG. 12 is a schematic diagram showing a magnetic storage apparatus according to a ninth embodiment of the present invention.
Figure 12:
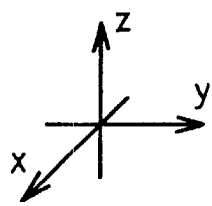

FIG. 12 shows a magnetic storage apparatus according to a ninth embodiment of the present invention. The magnetic recording apparatus shown in FIG. 12 includes a memory cell composed of a magnetization switching device and a means for reading out information stored in the memory.

In this apparatus, a magnetization direction of a magnetic layer to be controlled is converted into an electric signal by making use of a Hall effect to read out the magnetization direction of the magnetic layer as a magnetization state reflected by the electrical signal level. By setting normal and reversal magnetization directions of the magnetic layer to be controlled at the states "0" and "1", respectively, the magnetic apparatus of FIG. 12 may be a binary magnetic recording/reproducing apparatus, in which information can be written in the memory cell by the swing-by switching consistent with the present invention, and the information can be read out by making use of the Hall effect.

As shown in FIG. 12, the magnetic storage apparatus includes a magnetic switching device 72 having a columnar shape formed on the substrate 71. The magnetization switching device 72 constitutes a memory cell as described above. The magnetic storage apparatus also includes a cruciform pattern disposed such that the magnetic switching device 72 is located at the center of the pattern and formed on the substrate 71 in such a manner as to be in contact with the magnetization switching device 72. One arm pattern (e.g., Band $B^1$) of the cruciform pattern has a structure in which a lower wire 73, an insulating layer 74, and an upper wire 75 are sequentially stacked to each other, and another arm pattern (e.g., A and $A^1$ crossing the above arm pattern at right angles has a structure in which an insulting layer 76 and a wire 77 are sequentially stacked to each other.

The uppermost layer of the of the magnetization switching device 72 is formed by a magnetic layer 72a to be controlled, which is configured as a perpendicular magnetization film made from a ferromagnetic substance. The magnetic layer 72a to be controlled serves as a Hall element. The magnetic 72a to be controlled receives a drive force or a effect from another layer stacked thereon (for example, a piezoelectric layer imparting a stress to the 72a or a connection control layer for turning ON/OFF an exchange interaction, to perform the swing-by switching consistent with the present invention. To be more specific, the magnetization switching device 72 may be the same as that used in the first embodiment in which a perpendicular magnetization film is used as the strain sensitive magnetic thin film 3, or be the same as that used in the seventh embodiment. In addition, the lower wire 73 is connected to an electrode layer provided on the lowermost layer of the magnetization switching device 72.

The magnetic 72a to be controlled, which has a large perpendicular magnetic anisotropy and serves as the Hall device, may be formed by a multi-layer film in which 10 layers of Co (0.38 nm)/Pt (0.62 nm) are stacked to each other.

In this magnetic storage apparatus, when a current is made to flow between current supply terminals A and A' of the wire 76 around the magnetization switching device 72, a hall voltage occurs between Hall voltage measurement terminals B and B' disposed in the direction perpendicular to the current flow and the magnetization direction (raised from the film surface) of the magnetic 72a to be controlled. Accordingly, information stored in the memory cell composed of the magnetization switching device 72 can be read out by detecting the Hall voltage. Since a ferromagnetic substance having spontaneous magnetization exhibits an anomalous Hall effect which has a relatively large value proportional to the magnetization, it is convenient to obtain a large readout signal.

The combination of the Hall effect device and the magnetization switching device may be configured, if the device includes the magnetic layer to be controlled which has a magnetization direction within a plane, on the basis a hybrid Hall effect device (Mark Johnson, B. Bennet, M. Yang, M. Miller, and B. Shanabrook, Appl. Phys. Lett. 71, 974 (1977)). To be more specific, there may be produced a magnetic storage apparatus having a structure base consistent with the present invention where a magnetic flux spread from one side end of the magnetic layer to be controlled as the memory carrier of the structure in the direction perpendicular from the layer plane is received by a cruciform semiconductor pattern within a substrate surface of the structure.

As described above, according to the ninth embodiment, there can be realized a magnetic storage apparatus capable of reading out information by using the Hall effect. Further, since the magnetic 72a to be controlled serves as the Hall element, it is possible to reduce the number of components of the device and hence to simplify the process of producing the magnetic storage apparatus and improve the reliability.

Figure 13:
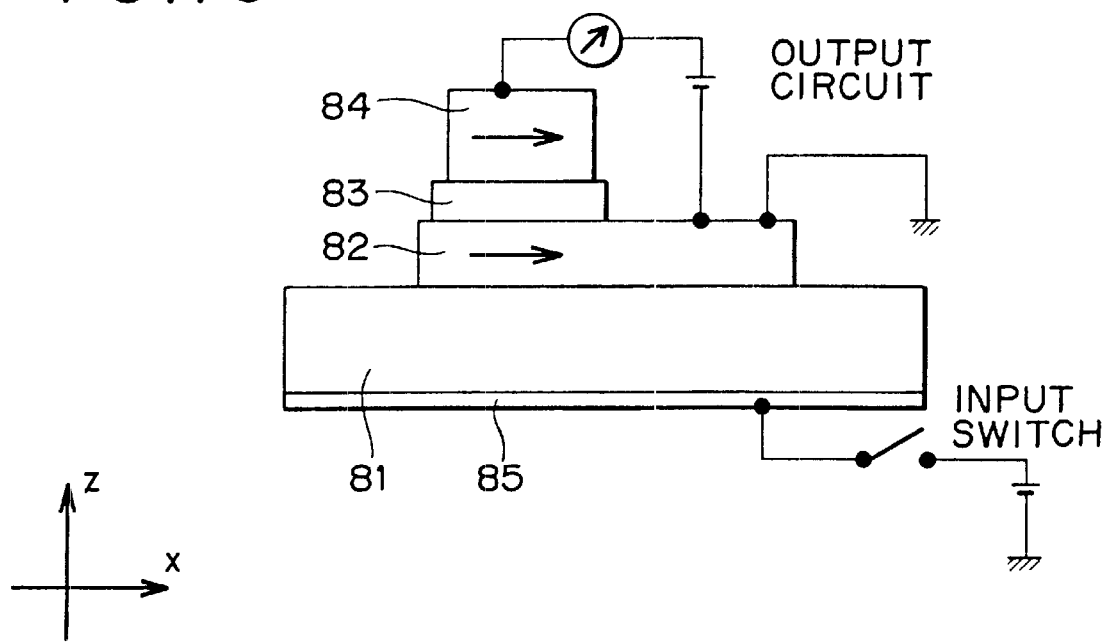
FIG. 13 is a schematic diagram showing a magnetic storage apparatus according to a tenth embodiment of the present invention.

FIG. 13 shows a magnetic storage apparatus according to a tenth embodiment of the present invention. In the embodiment shown in FIG. 13, the magnetic storage apparatus includes a memory cell composed of a magnetization switching device and a means for reading out information stored in the memory cell by using a magneto-resistance effect.

As shown in FIG. 13, the magnetic storage apparatus includes a magnetic layer 82 to be controlled (which is configured as a strain sensitive magnetic layer), a non-magnetic intermediate layer 83, and a fixed magnetization layer 84 sequentially stacked on a piezoelectric layer 81. A lower electrode 85 is provided on the back surface of the piezoelectric layer 81. These components constitute a magnetization switching device. A magnetization vector of the magnetic layer 82 to be controlled is driven by a strain imparted from the piezoelectric layer 81. The structure, in which the fixed magnetization layer 84 is stacked on the magnetic layer 82 to be controlled with the non-magnetic intermediate layer 83, constitutes a magneto-resistance element.

The lower electrode 85 is grounded via an input switch and a power supply. The magnetic layer 82 to be controlled is also grounded. An output circuit is connected to both terminals of the magneto-resistance element, that is, connected between the magnetic layer 82 to be controlled and the fixed magnetization layer 84.

An element of a type, in which a thin insulator is used as the non-magnetic intermediate layer 83 wherein a change in tunnel current is detected, is called a tunnel MR device. An element of a type, in which each of the magnetic layer 82 to be controlled, the non-magnetic intermediate layer 83, and the fixed magnetization layer 84 is made from a metal wherein a change in current in the in-plane direction of the stacked film is detected, is called a spin valve type giant magneto-resistance (GMR) element. In each type, the resistance becomes low when the magnetizations of both the magnetic layers are in parallel to each other, and becomes high when the magnetizations of both the magnetic layers are not in parallel to each other. Accordingly, it is possible to convert a magnetization direction of the magnetic layer to be controlled into an electric signal by the output circuit, and hence to read out information of the memory cell composed of the magnetization switching device.

As a structural example of the magneto-resistance element of the tunnel MR element, a Co film having a thickness of 10 nm is used as the fixed magnetization layer 84; an $Al_2O_3$ layer having a thickness of 2 nm is used as the non-magnetic intermediate layer 83; and a Fe—Rh alloy film having a thickness of 5 mn is used as a magnetic layer 82 to be controlled (which is configured as the strain sensitive magnetic layer). In addition, a Fe film having a thickness of 1.2 nm is inserted at the interface between the Co film, Fe—Rh alloy film, and $Al_2O_3$ layer for enhancing the MR ratio. As a structural example of the magneto-resistance element of the spin valve type GMR element, a multi-layer film of Co/Cu/Co often used for an HDD spin valve head is coupled to the magnetic layer 82 to be controlled which has a large magnetostriction.

As described above, according to the tenth embodiment, a magnetic storage apparatus consistent with the present invention is provided that is capable of reading out information by making use of the magneto-resistance effect. Further, since some of the layers constituting the magnetization switching device are used for forming the magneto-resistance element, it is possible to reduce the number of components of the device and hence to simplify the process of producing the magnetic storage apparatus and improve the reliability.

A magnetic storage apparatus according to an eleventh embodiment of the present invention will be described below.

According to the magnetic storage apparatus in this embodiment, magnetization switching devices driven by swing-by switching consistent with the present invention, each of which has the same structure as that described in each of the above-described embodiments, are collectively disposed on the same substrate in an array, to constitute an array of memory cells. Word lines and bit lines for selecting memory cells are provided on the memory cell array.

According to the eleventh embodiment, since the magnetization switching device driven by swing-by switching can achieve magnetization reversal at a high speed on the order of 1 nm without being obstructed by an insufficient damping even if the size of a magnetic substance forming an information carrier is reduced at about 10 nm, it is possible to achieve higher density, larger capacity, and higher speed operation of the magnetic storage apparatus.

The magnetic storage apparatus according to the eleventh embodiment is applicable not only to a storage unit for computers, but also to a broadcasting picture processor and a home picture server allowing high speed down-load from a web, and the magnetic storage apparatus, which is a rigid-solid-state storage apparatus, is suitable for a portable information terminal and a portable video camera recorder.

While the preferred embodiments of the present invention have been described, the present invention is not limited thereto, and it is to be understood that various changes may be made without departing from the technical scope of the present invention.

The numerical values, structures, shapes, materials, growth methods, processes, and the like described in the above first to eleventh embodiments are illustrative purposes only, and different numerical values, structures, shapes, materials, growth methods, processes, and the like can be adopted as needed.

For example, in the sixth embodiment, an antiferromagnetic layer may be contained in the layer structure as needed, to generate an exchange interaction from the antiferromagnetic layer, thereby giving an exchange bias to the magnetic layer to be controlled so that a magnetization of the magnetic layer to be controlled tends to be directed in a determined direction with no drive force applied thereto. The material used for the antiferromagnetic layer will be described below.

Materials, each exhibiting an antiferromagnetic order at a temperature more than the operational temperature of a magnetic functional device, may include alloys, oxides, and fluorides.

Mn exhibits an antiferromagnetic property in the form of a single γ-phase and also exhibits an antiferromagnetic property even in the form of an alloy with a 3d transition metal or a noble metal, and accordingly, such a metal can be used as a component of an alloy suitable for the present invention. In particular, an alloy containing Mn in an amount of 40 atomic % is preferable.

Examples, of the antiferromagnetic fluorides may include $FeF_2$, $MnF_2$, and $K_2NiF_4$. Some of the antiferromagnetic fluorides lose the antiferromagnetic property; however, they can be used in combination with different kinds of materials sustaining the antiferromagnetic property at high temperatures.

As a material having a property similar to the antiferromagnetic property suitable for the present invention, more specifically, being small in magnetization and large in magnetic anisotropy, there can be used a ferromagnetic substance such as a Tb—Co alloy, or an alloy containing a rare earth metal and a transition metal.

Antiferromagnetic Material Excellent in Corrosion Resistance

One of characteristics generally required for a functional apparatus is a resistance against corrosion during use or in a preservation environment. The materials used for the present invention may be desirable to be selected from this viewpoint.

An antiferromagnetic oxide is superior in corrosion resistance to a metal. An oxide exhibiting an antiferromagnetic order at a temperature more than room temperature in an operational environment of a magnetic storage apparatus is represented by NiO. Each of $\alpha\text{-}Fe_2O_3$, and $Cr_2O_3$ exhibits an antiferromagnetic property at room temperature. NiO can be used in a solid-solution to which another material is added for adjusting the characteristic of NiO. For example, a solid-solution containing NiO having a Neel temperature $T_n$, over which the antiferromagnetic property is lost, near 548 K, and CoO having the Neel temperature at 93 K which is lower than room temperature but having a magnetic anisotropy larger than that of NiO at room temperature, exhibits a magnetic anisotropy larger than that of NiO at room temperature. An antiferromagnetic material in which NiO and CaO are stacked is used for the same purpose.

An alloy containing a noble metal, for example, Ir—Mn, Pt—Mn, Pd—Pt—Mn, Rh—Mn, or Pt—Cr—Mn, is excellent in corrosion resistance.

Antiferromagnetic Material Excellent in Heat Resistance (High $T_N$ Material)

An antiferromagnetic substance used as a component of a functional device may be desired to keep an antiferromagnetic order for keeping a coupling to magnetization of a ferromagnetic substance not only at room temperature but also at an elevated environmental temperature. In particular, the temperature of the inside of a device becomes locally higher than an environmental temperature by heat generation of a circuit. To guarantee the operation of a device against such a locally increased temperature portion, it may be desirable to use an antiferromagnetic material having a high heat resistance as a component of the device.

A critical temperature over which an antiferromagnetic material loses an antiferromagnetic order, is called the Neel temperature $T_N$, and the maximum temperature at which the antiferromagnetic material exhibits a restrictive force to magnetization of a ferromagnetic substance in contact therewith is called a blocking temperature $T_B$.

An antiferromagnetic substance used for the present invention may be desirable to have a high $T_B$ from the viewpoint of thermal stability. The value $T_B$ is generally quite lower than $T_N$. An antiferromagnetic material having a higher $T_N$ exhibits a higher $T_B$. Examples of the materials known to be high in $T_B$ are listed in the following table. The material having a high $T_N$ often exhibits an antiferromagnetic property resulting from the fact that components of the material are regularly arranged, to form a superlattice structure, thereby causing the antiferromagnetic property. The formation of the superlattice structure does not occur unless the antiferromagnetic material is heat-treated at a temperature $T_{anneal}$ or more. This gives a limitation to production of the device; however, if the treatment temperature is in a range of 300° C. or less, there is no problem. This is because the temperature of the device easily reaches the above treatment temperature upon heating of the substrate usually performed for forming a thin film by deposition.

| Name of Material | $T_B$ (° C.) | $T_N$ (° C.) | $T_{anneal}$ (° C.) |
|---|---|---|---|
| Ni-Mn | 450 | 797 | 280 |
| Pt-Mn | 380 | 702 | 280 |
| Pt-Cr-Mn | 380 | | |
| Pd-Pt-Mn | 300 | | 230 |

Antiferromagnetic Material Easy in Production

Antiferromagnetic disorder alloys, typically, Fe—Mn, Ir—Mn, Rh—Mn, Ru—Mn, Pt—Cr—Mn, and Cr—Al, do not require any heat-treatment or any heating of substrate, and accordingly, an antiferromagnetic thin film used in the present invention can be easily produced from a disorder alloy by using a general thin film formation process such as sputtering.

What is claimed is:

1. A magnetization drive method for a magnetization switching device having an information carrier layer, the information carrier layer having a magnetic substance, the magnetization drive method comprising the step of:
    applying a drive force pulse having a predetermined duration to the magnetic substance of the information carrier layer, the magnetic substance having a magnetization vector; and
    changing a direction of said magnetization vector of said magnetic substance in response to applying the drive force pulse to said magnetic substance;
    wherein said drive force pulse is applied to said magnetic substance in a direction nearly perpendicular to said magnetization vector when said magnetization vector is in an initial state before the application of said drive force pulse.

2. The magnetization drive method according to claim 1, wherein said magnetization vector lies in a plane of the information carrier layer; and said drive force pulse is applied to said magnetic substance in a direction nearly perpendicular to said plane when said magnetization vector is in the initial state before the application of said drive force pulse.

3. The magnetization drive method according to claim 2, wherein said drive force pulse corresponds to an effective magnetic field applied along an axis nearly perpendicular to said first plane of the information carrier layer and the step of changing the direction comprises the step of rotating said magnetization vector about the axis nearly perpendicular to said first plane during the predetermined duration of said drive force pulse.

4. The magnetization drive method according to claim 3, wherein said first plane of the information carrier layer is tilted from a horizontal plane of said information carrier layer.

5. The magnetization drive method according to claim 3, wherein:
    said direction of said magnetization vector is one of a plurality of predetermined magnetization directions of said information carrier layer and said predetermined duration of said drive force pulse is one of a plurality of said predetermined durations of said drive force pulse, each predetermined duration of said plurality of predetermined durations corresponding to a respective one of said plurality of predetermined magnetization directions of said information carrier layer such that said magnetization vector may be rotated to one of said predetermined magnetization directions based on a respective one of said predetermined durations.

6. A magnetic functional device comprising:
    an information carrier layer having a magnetic substance and having a magnetization vector formed in said magnetic substance; and
    a drive force applying means for changing a direction of said magnetization vector of said information carrier layer, the direction of said magnetization vector being one of a plurality of predetermined magnetization directions of said information carrier layer, each of said plurality of predetermined magnetization directions corresponding to one of a plurality of information states;
    wherein said drive force applying means is operably configured to selectively apply a drive force pulse to said information carrier layer in a direction nearly perpendicular to said magnetization vector of said information carrier layer when said magnetization vector is in an initial state of said plurality of information states before the application of said drive force.

7. A magnetic functional device according to claim 6, wherein said information carrier layer and said drive force applying means are integrally assembled on a substrate to function as a solid-state device.

8. A magnetic functional device according to claim 7, wherein said drive force pulse corresponds to an effective magnetic field derived from a magnetic anisotropy of said information carrier layer, said effective magnetic field having a field vector aligned in the direction nearly perpendicular to said magnetization vector of said information layer.

9. A magnetic functional device according to claim 7, further comprising a fixed magnetic layer, wherein said drive force pulse corresponds to an effective magnetic field derived from an exchange interaction between said fixed magnetic layer and said information carrier layer.

10. A magnetic functional device according to claim 7, wherein:
    said magnetic substance of said information carrier layer has a uniaxial magnetic anisotropy and has an easy axis of magnetization in a plane of said information carrier layer;
    said plurality of information states corresponds to binary information states, the binary information states reflect predetermined normal and reversal magnetization directions of said magnetization vector disposed along said easy axis of magnetization of said magnetic substance; and
    said drive force pulse is applied in the direction nearly perpendicular to said easy axis of magnetization of said information carrier layer.

11. A magnetic functional device according to claim 6, wherein said drive force pulse corresponds to an effective magnetic field derived from a magnetic anisotropy of said information carrier layer, said effective magnetic field having a field vector aligned in the direction nearly perpendicular to said magnetization vector of said information layer.

12. A magnetic functional device according to claim 6, further comprising a fixed magnetic layer, wherein said drive force pulse corresponds to an effective magnetic field derived from an exchange interaction between said fixed magnetic layer and said information carrier layer.

13. A magnetic functional device according to claim 6, wherein:
   said magnetic substance of said information carrier layer has a uniaxial magnetic anisotropy and has an easy axis of magnetization lying in a plane of said information carrier layer;
   said plurality of information states corresponds to binary information states, the binary information states reflect predetermined normal and reversal magnetization directions of said magnetization vector disposed along said easy axis of magnetization of said magnetic substance; and
   said drive force pulse is applied in the direction nearly perpendicular to said easy axis of magnetization of said information carrier layer.

14. The magnetic functional device of claim 6, wherein the magnetization vector lies in a first plane of said information carrier layer; and said drive force applying means is operably configured to selectively apply a drive force pulse to said information carrier layer in a direction nearly perpendicular to said first plane of said information carrier layer when said magnetization vector is in the initial state of said plurality of information states before the application of said drive force.

15. A magnetic functional device comprising:
   an information carrier layer having a magnetic substance, an easy axis of magnetization, and a magnetization vector formed in said magnetic substance, said magnetic substance having a uniaxial magnetic anisotropy; and
   a drive force applying means for applying a drive force to reverse a direction of said magnetization vector of said information carrier layer, said drive force selectively applied as a pulse to said information carrier layer in a direction nearly perpendicular to said easy axis of magnetization of said information carrier layer when said information carrier layer is in a static state, thereby processing binary information by magnetization directions of said information carrier layer;
   wherein said drive force corresponds to a magnetic anisotropy generated in said magnetic substance such that said magnetic anisotropy has an easy axis of magnetization aligned in the direction nearly perpendicular to said easy axis of magnetization of said information carrier layer in the static state.

16. A magnetic functional device according to claim 15, wherein said magnetic anisotropy generated in said magnetic substance is a stress-induced magnetic anisotropy.

17. A magnetic functional device according to claim 16, further comprising a piezoelectric layer, wherein:
   said information carrier layer includes a magnetic thin film that incorporates said magnetic substance;
   said uniaxial magnetic anisotropy of said magnetic substance is adapted to change so that said stress-induced magnetic anisotropy is produced in response to a strain present on said magnetic thin film;
   said magnetic thin film is stacked over said piezoelectric layer; and
   said strain is generated by said piezoelectric layer when a voltage is present on said piezoelectrical layer.

18. A magnetic functional device according to claim 16, further comprising a strain imparting layer, wherein:
   said information carrier layer includes a magnetic thin film that incorporates said magnetic substance;
   said uniaxial magnetic anisotropy of said magnetic substance is adapted to change so that said stress-induced magnetic anisotropy is produced in response to a strain present on said magnetic thin film;
   said magnetic thin film is stacked over said strain imparting layer; and
   said strain imparting layer is adapted to generate a uniaxial strain in a specific direction within a plane of said strain imparting layer in response to a voltage present on said strain imparting layer and to present said uniaxial strain strain to said magnetic thin film such that said stress-induced magnetic anisotropy the second easy axis of magnetization directed in said specific direction.

19. A magnetic functional device according to claim 15, wherein said information carrier layer includes a perpendicular magnetization film having said easy axis of magnetization in said static state which is directed in the direction perpendicular to a horizontal plane of said perpendicular magnetization film; and
   said drive force is applied in a direction nearly parallel to the horizontal plane of said perpendicular magnetization film.

20. A magnetic functional device according to claim 15, wherein said information carrier layer is formed to have a plurality of dimensions, each dimension is in a range of 500 nm or less.

21. The magnetic functional device of claim 15, wherein said easy axis of magnetization and said magnetization vector of said information carrier layer both lie in a first plane of said information carrier layer; and said drive force is selectively applied as a pulse to said information carrier layer in a direction nearly perpendicular to the first plane of said information carrier layer when said information carrier layer is in the static state, thereby processing binary information by magnetization directions of said information carrier layer.

22. A magnetic functional device comprising:
   a fixed magnetic layer;
   an information carrier layer formed over said fixed magnetic layer and having a magnetic substance, an easy axis of magnetization, and a magnetization vector formed in said magnetic substance, said magnetic substance having a uniaxial magnetic anisotropy; and
   a drive force applying means for applying a drive force to reverse a direction of said magnetization vector of said information carrier layer, said drive force selectively applied as a pulse to said information carrier layer in a direction nearly perpendicular to said easy axis of magnetization of said information carrier layer when said information carrier layer is in a static state, thereby processing binary information by magnetization directions of said information carrier layer;
   wherein said drive force is generated by an exchange interaction between said fixed magnetic layer and said information carrier layer.

23. A magnetic functional device according to claim 22, wherein said information carrier layer includes a thin magnetic film having said magnetic substance, said easy axis of magnetization in said static state being within a plane of said information carrier layer; and
   said drive force is applied in the direction nearly perpendicular to the plane of said information carrier layer.

24. A magnetic functional device according to claim 23, further comprising an intermediate disposed between said information carrier layer and said fixed magnetic layer, said exchange interaction has a strength corresponding to a characteristic of said intermediate layer.

25. A magnetic functional device according to claim 22, wherein said information carrier layer includes a perpendicular magnetization film having said easy axis of magnetization in said static state such that said easy axis of magnetization is perpendicular to a horizontal plane of said perpendicular magnetization film; and said drive force is applied in a direction nearly parallel to the horizontal plane of said perpendicular magnetization film.

26. A magnetic functional device according to claim 22, wherein a magnetic layer to be controlled, which is formed by said perpendicular magnetization film constituting said information carrier layer, is stacked on a fixed magnetic layer via a connection control layer; and said exchange interaction between said magnetic layer to be controlled and said fixed magnetic layer has a strength corresponding to a characteristic of said connection control layer.

27. A magnetic functional device according to claim 22, wherein said information carrier layer is formed to have a plurality of dimensions, each dimension is in a range of 500 nm or less.

28. The magnetic functional device of claim 22, wherein said easy axis of magnetization and said magnetization vector of said information carrier layer both lie in a first plane of said information carrier layer; and said drive force is selectively applied as a pulse to said information carrier layer in a direction nearly perpendicular to the first plane of said information carrier layer when said information carrier layer is in a static state, thereby processing binary information by magnetization directions of said information carrier layer.

29. A magnetic functional device comprising:

an information carrier layer having a magnetic substance, an easy axis of magnetization, and a magnetization vector formed in said magnetic substance, said magnetic substance having a uniaxial magnetic anisotropy; and a drive force applying means for applying a drive force to reverse a direction of said magnetization vector of said information carrier layer, said drive force selectively applied as a pulse to said information carrier layer in a direction nearly perpendicular to said easy axis of magnetization of said information carrier layer when said information carrier layer is in a static state, thereby processing binary information by magnetization directions of said information carrier layer;

wherein said drive force is derived from a magnetic field applied to said information carrier layer from an external source.

30. A magnetic functional device according to claim 29, wherein said information carrier layer is formed to have a plurality of dimensions, each dimension is in a range of 500 nm or less.

31. A magnetic functional device comprising:

an information carrier layer having a magnetic substance, an easy axis of magnetization, and a magnetization vector formed in said magnetic substance, said magnetic substance having a uniaxial magnetic anisotropy; and a drive force applying means for applying a drive force to reverse a direction of said magnetization vector of said information carrier layer, said drive force selectively applied as a pulse to said information carrier layer in a direction nearly perpendicular to said easy axis of magnetization of said information carrier layer when said information carrier layer is in a static state, thereby processing binary information by magnetization directions of said information carrier layer;

wherein said information carrier layer has a composite structure in which two or more magnetic substance layers are stacked to each other.

32. A magnetic functional device according to claim 31, wherein said two or more magnetic substance layers constituting said information carrier layer include a magnetic substance layer having the easy axis of magnetization of said information carrier layer directed in the direction nearly perpendicular to a plane of said magnetic substance layer.

33. A magnetic functional device according to claim 31, wherein said two or more magnetic substance layers constituting said information carrier layer are composed of an anisotropy imparting layer and a magnetic thin film having a magnetic anisotropy that changes in response to a strain on said magnetic thin film.

34. A magnetic functional device according to claim 33, further comprising a strain imparting layer, wherein said strain imparting layer, said magnetic thin film, and said anisotropy imparting layer are sequentially stacked to each other.

35. A magnetic functional device according to claim 33, further comprising a connection control layer and a fixed magnetic layer, wherein said magnetic thin film, said anisotropy imparting layer, said connection control layer, and said fixed magnetic layer are sequentially stacked to each other.

36. A magnetic functional device according to claim 33, further comprising a strain imparting layer, a connection control layer and a fixed magnetic layer, wherein said strain imparting layer, said magnetic thin film, said anisotropy imparting layer, said connection control layer, and said fixed magnetic layer are sequentially stacked to each other.

37. A magnetic functional device according to claim 31, wherein said information carrier layer is formed to have a plurality of dimensions, each dimension is in a range of 500 nm or less.

38. A magnetic functional device comprising:

an information carrier layer having a magnetic substance, an easy axis of magnetization, and a magnetization vector formed in said magnetic substance, said magnetic substance having a uniaxial magnetic anisotropy; and a drive force applying means for applying a drive force to reverse a direction of said magnetization vector of said information carrier layer, said drive force selectively applied as a pulse to said information carrier layer in a direction nearly perpendicular to said easy axis of magnetization of said information carrier layer when said information carrier layer is in a static state, thereby processing binary information by magnetization directions of said information carrier layer;

wherein said magnetization vector in said static state of said information carrier layer is tilted by a specific angle with respect to said easy axis of magnetization in said static state.

39. A magnetic apparatus comprising:

(A) a magnetic functional device including: an information carrier formed by a magnetic substance; and drive force applying means for changing the direction of a magnetization vector of said information carrier, thereby processing binary or more information by magnetization directions of said information carrier;

wherein said drive force is applied in pulse to said information carrier in the direction nearly perpendicular to said magnetization vector of said information carrier in the initial state before the application of said drive force; and (B) means for reading out a magnetization direction of said information carrier of said magnetic function device by a Hall effect or magneto-resistance effect.

40. A magnetic apparatus comprising:

(A) a magnetic functional device including: an information carrier formed by a magnetic substance having a uniaxial magnetic anisotropy; and drive force applying means for applying a drive force, which is used for reversing the direction of a magnetization vector of said information carrier, in pulse to said information carrier in the direction nearly perpendicular to an easy axis of magnetization of said information carrier in a static state, thereby processing binary information by magnetization directions of said information carrier; wherein said drive force is obtained by generating a magnetic anisotropy having an easy axis of magnetization directed in the direction nearly perpendicular to said easy axis of magnetization of said information carrier in the static state; and (B) means for reading out a magnetization direction of said information carrier of said magnetic function device by a Hall effect or magneto-resistance effect.

41. A magnetic apparatus comprising:

(A) a magnetic functional device including: an information carrier formed by a magnetic substance having a uniaxial magnetic anisotropy; and drive force applying means for applying a drive force, which is used for reversing the direction of a magnetization vector of said information carrier, in pulse to said information carrier in the direction nearly perpendicular to an easy axis of magnetization of said information carrier in a static state, thereby processing binary information by magnetization directions of said information carrier; wherein said drive force is generated by an exchange interaction applied from a different magnetic substance provided adjacently to said information carrier; and (B) means for reading out a magnetization direction of said information carrier of said magnetic function device by a Hall effect or magneto-resistance effect.

42. A magnetic apparatus comprising:

(A) a magnetic functional device including: an information carrier formed by a magnetic substance having a uniaxial magnetic anisotropy; and drive force applying means for applying a drive force, which is used for reversing the direction of a magnetization vector of said information carrier, in pulse to said information carrier in the direction nearly perpendicular to an easy axis of magnetization of said information carrier in a static state, thereby processing binary information by magnetization directions of said information carrier; wherein said drive force is derived from a magnetic field applied to said information carrier from external; and (B) means for reading out a magnetization direction of said information carrier of said magnetic function device by a Hall effect or magneto-resistance effect.

43. A magnetic apparatus comprising:

(A) a magnetic functional device including: an information carrier formed by a magnetic substance having a uniaxial magnetic anisotropy; and drive force applying means for applying a drive force, which is used for reversing the direction of a magnetization vector of said information carrier, in pulse to said information carrier in the direction nearly perpendicular to an easy axis of magnetization of said information carrier in a static state, thereby processing binary information by magnetization directions of said information carrier; wherein said information carrier has a composite structure in which two or more magnetic substance layers are stacked to each other; and (B) means for reading out a magnetization direction of said information carrier of said magnetic function device by a Hall effect or magneto-resistance effect.

44. A magnetic apparatus comprising:

(A) a magnetic functional device including: an information carrier formed by a magnetic substance having a uniaxial magnetic anisotropy; and drive force applying means for applying a drive force, which is used for reversing the direction of a magnetization vector of said information carrier, in pulse to said information carrier in the direction nearly perpendicular to an easy axis of magnetization of said information carrier in a static state, thereby processing binary information by magnetization directions of said information carrier; wherein the magnetization vector in the static state of said information carrier is tilted by a specific angle with respect to said easy axis of magnetization in said static state; and (B) means for reading out a magnetization direction of said information carrier of said magnetic function device by a Hall effect or magneto-resistance effect.

* * * * *